(12) United States Patent
Shibata et al.

(10) Patent No.: US 10,100,434 B2
(45) Date of Patent: Oct. 16, 2018

(54) NITRIDE SEMICONDUCTOR SINGLE CRYSTAL SUBSTRATE MANUFACTURING METHOD

(71) Applicant: SUMITOMO CHEMICAL COMPANY, LIMITED, Tokyo (JP)

(72) Inventors: Masatomo Shibata, Hitachi (JP); Takehiro Yoshida, Hitachi (JP); Takayuki Suzuki, Hitachi (JP); Yukio Abe, Hitachi (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 0 days.

(21) Appl. No.: 15/123,220

(22) PCT Filed: Apr. 14, 2014

(86) PCT No.: PCT/JP2014/060609
§ 371 (c)(1),
(2) Date: Sep. 1, 2016

(87) PCT Pub. No.: WO2015/159342
PCT Pub. Date: Oct. 22, 2015

(65) Prior Publication Data
US 2017/0067182 A1    Mar. 9, 2017

(51) Int. Cl.
*C30B 25/18*        (2006.01)
*C23C 16/34*        (2006.01)
(Continued)

(52) U.S. Cl.
CPC ............ *C30B 25/186* (2013.01); *C23C 16/01* (2013.01); *C23C 16/303* (2013.01); *C23C 16/34* (2013.01);
(Continued)

(58) Field of Classification Search
CPC combination set(s) only.
See application file for complete search history.

(56) References Cited

U.S. PATENT DOCUMENTS

| | | |
|---|---|---|
| 6,413,627 B1 | 7/2002 | Motoki et al. |
| 6,426,519 B1 | 7/2002 | Asai et al. |
| | (Continued) | |

FOREIGN PATENT DOCUMENTS

| | | |
|---|---|---|
| JP | 2000-12900 A | 1/2000 |
| JP | 2001-176813 A | 6/2001 |
| | (Continued) | |

OTHER PUBLICATIONS

Machine translation of JP2011-057479.*
(Continued)

*Primary Examiner* — Erin F Bergner
(74) *Attorney, Agent, or Firm* — McGinn I. P. Law Group. PPLC.

(57) ABSTRACT

A nitride semiconductor single crystal substrate manufacturing method includes providing a template that a first nitride semiconductor single crystal layer is hetero-epitaxially grown on a heterogeneous substrate, forming a plurality of linear grooves on a surface of the template that have a depth reaching an inside of the heterogeneous substrate, wherein a pattern of the plurality of the linear grooves has three-fold or six-fold rotational symmetry with respect to a central axis of the template, epitaxially growing a second nitride semiconductor single crystal layer on the template with the plurality of the linear grooves formed thereon, and cutting a nitride semiconductor single crystal substrate from the second nitride semiconductor single crystal layer.

32 Claims, 4 Drawing Sheets

(51) Int. Cl.
  *C30B 29/38*     (2006.01)
  *C23C 16/01*     (2006.01)
  *C30B 29/40*     (2006.01)
  *H01L 21/02*     (2006.01)
  *H01L 21/306*    (2006.01)
  *H01L 29/20*     (2006.01)
  *H01L 29/207*    (2006.01)
  *C23C 16/30*     (2006.01)

(52) U.S. Cl.
  CPC ............ *C30B 25/183* (2013.01); *C30B 29/38* (2013.01); *C30B 29/403* (2013.01); *H01L 21/0242* (2013.01); *H01L 21/0243* (2013.01); *H01L 21/0254* (2013.01); *H01L 21/0262* (2013.01); *H01L 21/02389* (2013.01); *H01L 21/02458* (2013.01); *H01L 21/02516* (2013.01); *H01L 21/02576* (2013.01); *H01L 21/02598* (2013.01); *H01L 21/02631* (2013.01); *H01L 21/02639* (2013.01); *H01L 21/02647* (2013.01); *H01L 21/30612* (2013.01); *H01L 29/2003* (2013.01); *H01L 29/207* (2013.01)

(56) References Cited

U.S. PATENT DOCUMENTS

| | | |
|---|---|---|
| 6,447,604 B1 | 9/2002 | Flynn et al. |
| 6,596,079 B1 | 7/2003 | Vaudo et al. |
| 6,693,021 B1 | 2/2004 | Motoki et al. |
| 8,928,004 B2 | 1/2015 | Choe et al. |
| 2002/0197825 A1 | 12/2002 | Usui et al. |
| 2003/0134446 A1* | 7/2003 | Koike ................. H01L 21/0237 438/41 |
| 2003/0157376 A1 | 8/2003 | Vaudo et al. |
| 2003/0205193 A1* | 11/2003 | Melnik ................... C30B 11/00 117/102 |
| 2004/0072410 A1 | 4/2004 | Motoki et al. |
| 2005/0048685 A1* | 3/2005 | Shibata ................... C30B 25/18 438/46 |
| 2007/0105351 A1 | 5/2007 | Motoki et al. |
| 2008/0118733 A1 | 5/2008 | Oshima |
| 2009/0263955 A1 | 10/2009 | Motoki et al. |
| 2011/0163323 A1 | 7/2011 | Motoki et al. |
| 2012/0111264 A1 | 5/2012 | Shimodaira et al. |
| 2012/0241755 A1 | 9/2012 | Romanov et al. |
| 2013/0207143 A1* | 8/2013 | Chou ...................... H01L 33/20 257/98 |
| 2014/0077223 A1 | 3/2014 | Choe et al. |

FOREIGN PATENT DOCUMENTS

| | | |
|---|---|---|
| JP | 2001-210598 A | 8/2001 |
| JP | 2003-124576 A | 4/2003 |
| JP | 2003-178984 A | 6/2003 |
| JP | 2005-136311 A | 5/2005 |
| JP | 2006-273716 A | 10/2006 |
| JP | 2008-127252 A | 6/2008 |
| JP | 2011-027479 A | 2/2011 |
| JP | 2011-057479 A | 3/2011 |
| JP | 2011-134948 A | 7/2011 |
| JP | 2012-006794 A | 1/2012 |
| JP | 2012-017259 A | 1/2012 |
| JP | 2012-121769 A | 6/2012 |
| JP | 2013-504865 A | 2/2013 |
| WO | WO 2011/004904 A1 | 1/2011 |
| WO | WO 2013/021606 A1 | 2/2013 |

OTHER PUBLICATIONS

English Translation of the International Preliminary Report on Patentability (PCT/IB/338) in PCT Application No. PCT/JP2014/060609 dated Oct. 27, 2016.

International Search Report (ISR) (PCT Form PCT/ISA/210), in PCT/JP2014/060609, dated Jul. 15, 2014.

Japanese Office Action dated Jan. 17, 2017, with an English translation thereof.

Japanese Office Action dated May 16, 2017 with an English translation thereof.

* cited by examiner

NITRIDE SEMICONDUCTOR SINGLE CRYSTAL SUBSTRATE MANUFACTURING METHOD

TECHNICAL FIELD

The present invention relates to a method for manufacturing a nitride semiconductor single crystal substrate.

BACKGROUND ART

Conventionally, a technology to grow a nitride semiconductor crystal on a heterogeneous substrate such as sapphire is known (see e.g. PTLs 1 to 4).

According to PTL 1, after a base layer made of a nitride semiconductor is formed on a heterogeneous substrate, convexity and concavity are formed by etching the base layer through the heterogeneous substrate, and then the nitride semiconductor is grown on the base layer that has the convexity and concavity. In the concavity, a gap is formed between the heterogeneous substrate and the nitride semiconductor. When the electromagnetic wave is irradiated to the heterogeneous substrate in this situation, the heterogeneous substrate and the nitride semiconductor can be separated at interface therebetween.

According to PTLs 2, 3, after a base layer made of a nitride semiconductor is formed on a heterogeneous substrate, convexity and concavity are formed only on the base layer, and then the nitride semiconductor is grown on the base layer that has the convexity and concavity. In the concavity, a gap is formed between the heterogeneous substrate and the nitride semiconductor, and the nitride semiconductor is grown in the lateral direction and vertical direction. Thereby, a strain in the grown nitride semiconductor can be reduced.

According to PTL 4, after a base layer made of a nitride semiconductor is formed on a heterogeneous substrate, a groove is formed on the surface of the heterogeneous substrate that is exposed in a groove formed in the base layer. Then, the nitride semiconductor is grown on the base layer. A gap is formed between the heterogeneous substrate and the nitride semiconductor in a concavity. Since the groove is formed on the surface of the heterogeneous substrate, the heterogeneous substrate can be broken so as to reduce the strain in the nitride semiconductor when the stress is caused by a difference in thermal expansion coefficient between the heterogeneous substrate and the grown nitride semiconductor.

CITATION LIST

Patent Literature

PTL1: JP-A-2001-176813
PTL2: JP-A-2003-124576
PTL3: JP-A-2013-504865
PTL4: JP-A-2011-057479

SUMMARY OF INVENTION

Technical Problem

It is an object of the invention to provide a nitride semiconductor single crystal substrate manufacturing method that suppresses the occurrence of the crack by relaxing the strain in the grown nitride semiconductor single crystal and that allows a high quality nitride semiconductor single crystal substrate to be efficiently obtained.

Solution to Problem

To achieve the above object, an embodiment of the invention provides a nitride semiconductor single crystal substrate manufacturing method set forth in [1] to [27].

[1] A nitride semiconductor single crystal substrate manufacturing method, comprising:
providing a template that a first nitride semiconductor single crystal layer is hetero-epitaxially grown on a heterogeneous substrate;
forming a plurality of linear grooves on a surface of the template that have a depth reaching an inside of the heterogeneous substrate, wherein a pattern of the plurality of the linear grooves has three or six rotational symmetry with respect to a central axis of the template;
epitaxially growing a second nitride semiconductor single crystal layer on the template with the plurality of the linear grooves formed thereon; and
cutting a nitride semiconductor single crystal substrate from the second nitride semiconductor single crystal layer.

[2] The method according to [1], wherein the first nitride semiconductor single crystal layer is an $Al_XGa_{(1-X)}N$ ($0 \leq X \leq 1$) crystal grown by MOCVD method or HYPE method.

[3] The method according to [1] or [2], wherein the second nitride semiconductor single crystal layer is an $Al_YGa_{(1-Y)}N$ ($0 \leq Y \leq 1$) crystal grown by HYPE method.

[4] The method according to [1] or [2], wherein the first nitride semiconductor single crystal layer and the second nitride semiconductor single crystal layer have a same composition.

[5] The method according to [1], wherein a thickness of the heterogeneous substrate of a region just below the plurality of the linear grooves except an intersection point of the plurality of the linear grooves is not less than 50 μm and not more than 200 μm.

[6] The method according to [1], wherein a thickness of the heterogeneous substrate of a region just below an intersection point of the plurality of the linear grooves is less than the thickness of the heterogeneous substrate at a region just below the plurality of the grooves except the intersection point of the plurality of the grooves.

[7] The method according to [1], wherein a width of the plurality of the linear grooves in the first nitride semiconductor single crystal layer is not less than 10 μm and not more than 100 μm.

[8] The method according to [1], wherein a width of the plurality of the linear grooves in the heterogeneous substrate is equal to a width of the plurality of the linear grooves in the first nitride semiconductor single crystal layer.

[9] The method according to [1], wherein a depth of the plurality of the linear grooves in the heterogeneous substrate is not less than three times a width of the plurality of the linear grooves in the first nitride semiconductor single crystal layer.

[10] The method according to [10], wherein a thickness of the first nitride semiconductor single crystal layer is not less than 1 μm and not more than 10 μm.

[11] The method according to [1], wherein a thickness of the second nitride semiconductor single crystal layer is not less than 500 μm.

[12] The method according to [1], wherein a thickness of the heterogeneous substrate at a region just below the plurality of the linear grooves except an intersection point of the plurality of the linear grooves is not more than one tenth of a thickness of the grown second nitride semiconductor single crystal layer.

[13] The method according to [1], wherein the template having the plurality of the linear grooves is etched before growing the second nitride semiconductor single crystal layer.

[14] The method according to [13], wherein the etching is conducted in a heated mixed liquid of phosphoric acid and sulfuric acid.

[15] The method according to [1], wherein an upper surface of the first nitride semiconductor single crystal layer is a c-plane of a single crystal that composes the first nitride semiconductor single crystal layer or a surface inclined within 5° from the c-plane.

[16] The method according to [15], wherein the plurality of the linear grooves are parallel to an a-plane or a m-plane of a single crystal that composes the first nitride semiconductor single crystal layer.

[17] The method according to [16], wherein a pitch between parallel grooves of the plurality of the linear grooves is not less than 100 μm and not more than 10 mm.

[18] The method according to [1], wherein the first nitride semiconductor single crystal layer is sectioned by the plurality of the linear grooves into a plurality of regions having an equal area.

[19] The method according to [1], wherein a groove processing in the first nitride semiconductor single crystal layer and a groove processing in the heterogeneous substrate are conducted in a same process in the forming of the plurality of the linear grooves.

[20] The method according to [1], wherein the second nitride semiconductor single crystal layer is epitaxially grown so as to leave gaps in the plurality of the linear grooves in the heterogeneous substrate.

[21] The method according to [20], wherein after the second nitride semiconductor single crystal layer is grown, all of the gaps are connected in the plurality of the linear grooves in the heterogeneous substrate and are connected to an external space of the heterogeneous substrate through an opening of the plurality of the linear grooves at an outer periphery of the heterogeneous substrate.

[22] The method according to [1], wherein the second nitride semiconductor single crystal layer is epitaxially grown such that a polycrystal or an amorphous phase that has a same composition as the second nitride semiconductor single crystal layer is formed in the plurality of the linear grooves in the heterogeneous substrate.

[23] The method according to [1], wherein the second nitride semiconductor single crystal layer is grown such that the second nitride semiconductor single crystal layer becomes a continuous film that covers an upper of the plurality of the linear grooves.

[24] The method according to [1], wherein the second nitride semiconductor single crystal layer is grown while leaving on a growth interface a concavity and convex corresponding to a shape of a region of the first nitride semiconductor single crystal layer sectioned by the plurality of the linear grooves.

[25] The method according to [1], wherein before cutting the nitride semiconductor single crystal substrate from the second nitride semiconductor single crystal layer, an outer periphery of the second nitride semiconductor single crystal layer of that is not less than 5 mm in thickness is removed.

[26] The method according to [1], wherein the first nitride semiconductor single crystal layer is grown by being substantially undoped and the second nitride semiconductor single crystal layer is grown intentionally by doping an impurity.

[27] The method according to [26], wherein the impurity comprises at least one selected from Si, S, Se, Ge, O, Fe, Mg and Zn, and
wherein a concentration of the impurity doped into the second nitride semiconductor single crystal layer is not less than $5 \times 10^{17}$ cm$^{-3}$.

Advantageous Effects of Invention

According to the invention, a nitride semiconductor single crystal substrate manufacturing method can be provided that suppresses the occurrence of the crack by relaxing the strain in the grown nitride semiconductor single crystal and that allows a high quality nitride semiconductor single crystal substrate to be efficiently obtained.

DESCRIPTION OF EMBODIMENT

[First Embodiments]

FIGS. 1A to 1E are vertical cross sectional views showing schematically steps for manufacturing a nitride semiconductor single crystal substrate in the first embodiment.

Figure 1A:
FIG. 1A is a vertical cross sectional view showing schematically a step for manufacturing a nitride semiconductor single crystal substrate in a first embodiment.
Figure 1B:
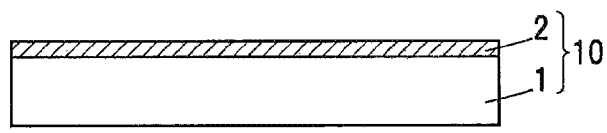
FIG. 1B is a vertical cross sectional view showing schematically a step for manufacturing the nitride semiconductor single crystal substrate in the first embodiment.
Figure 1C:
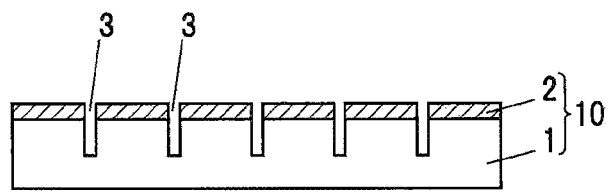
FIG. 1C is a vertical cross sectional view showing schematically a step for manufacturing the nitride semiconductor single crystal substrate in the first embodiment.
Figure 1D:
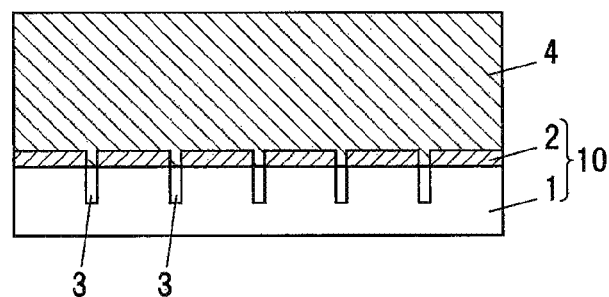
FIG. 1D is a vertical cross sectional view showing schematically a step for manufacturing the nitride semiconductor single crystal substrate in the first embodiment.
Figure 1E:
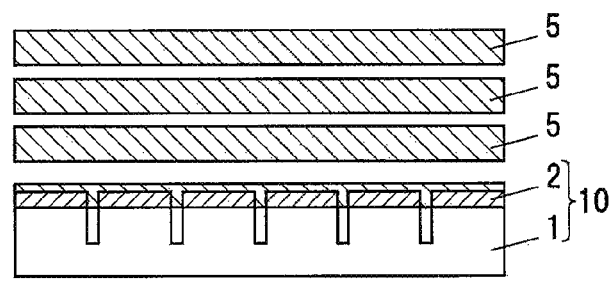
FIG. 1E is a vertical cross sectional view showing schematically a step for manufacturing the nitride semiconductor single crystal substrate in the first embodiment.

First, as shown in FIG. 1A, a heterogeneous substrate that is made of other material from a nitride semiconductor is provided. Next, as shown in FIG. 1B, a template 10 is obtained by hetero-epitaxially growing a first nitride semiconductor single crystal layer 2 on the heterogeneous substrate 1. Next, as shown in FIG. 1C, a groove 3 is formed in the template 10. Next, as shown in FIG. 1D, a second nitride semiconductor single crystal layer 4 is epitaxially grown on the template 10 that is applied a groove processing. Next, as shown in FIG. 1E, a nitride semiconductor crystal substrate 5 is cut from the second nitride semiconductor single crystal layer 4. Below, the configurations of the each of the processes will be explained in detail.

First, as shown in FIG. 1A, the heterogeneous substrate 1 that is made of other material from the nitride semiconductor is provided. A diameter of the heterogeneous substrate 1 is determined by considering a thickness of an outer periphery of the nitride semiconductor substrate 4 being removed by treatment after the crystal growth on a basis of an objective diameter of the nitride semiconductor substrate 5 finally obtained. The process to remove the outer periphery of the nitride semiconductor single crystal 4 is described later.

It is preferable to use a sapphire substrate as the heterogeneous substrate 1. In particular, for example, a c-plane sapphire substrate that has a diameter of 65 mm and a thickness of 400 μm, and that is commercially available for GaN epitaxial crystal growth can be used.

This is because, as the sapphire substrate, an industrially excellent mass production technology of the substrate for growing semiconductor crystal is established, even a large-diameter substrate can be obtained relatively, and a production technology of the GaN template is established. Also, as long as sapphire, a groove processing by a laser processing machine described later is easy and an exposed section in the groove 3 when the second nitride semiconductor single crystal layer 4 is grown is not pyrolyzed or does not degenerate by reacting with a material for GaN growing or atmosphere gas. Also a wafer strength that becomes problem in handling is high. Although a Si substrate, a GaAs substrate, a ZnO substrate, and a $Ga_2O_3$ substrate are listed substrates excepting the sapphire substrate. However they have limitation for using about homeostasis (reactivity) or easiness of obtainment comparing with the sapphire.

Next, as shown in FIG. 1B, a first nitride semiconductor single crystal layer 2 is hetero-epitaxially grown on the heterogeneous substrate 1. Hereby, the template 10 that is provided with the heterogeneous substrate 1 and the first nitride semiconductor single crystal layer 2 is obtained.

The first nitride semiconductor single crystal layer 2 is made of a nitride semiconductor single crystal of which the compositional formula is $Al_xGa_{(1-x)}N$ ($0 \leq x \leq 1$). The first nitride semiconductor crystal layer 2 is, for example, an undoped GaN membrane (film?) that has a thickness of 2 μm.

The first nitride semiconductor single crystal layer 2 is preferable to be formed by the MOCVD (Metal Organic Chemical Vapor Deposition) method or the HVPE (Hydride Vapor Phase Epitaxy) method. It is because that the technology for growing the nitride semiconductor single crystal layer on the heterogeneous substrate such as sapphire using these methods is already established and it is easy to obtain the template that has the excellent crystallinity nitride semiconductor single crystal layer on the surface.

Moreover, it is preferable to apply a low-temperature buffer layer inserting technology that is largely used for GaN hetero-epitaxially growing to increase crystallinity of the first nitride semiconductor single crystal layer 2 and insulate flatness of the surface. For example, JP-B-3026087 discloses the technology to hetero-epitaxially grow the GaN crystal on the sapphire substrate using the low-temperature buffer layer.

As the nitride semiconductor single crystal grows on the heterogeneous substrate 1 directly, a 3D island growth of the nitride semiconductor single crystal in early stage of the growth and stress occurs in the nitride semiconductor single crystal caused by the 3D island growth. In the present embodiment, as the first nitride semiconductor single crystal layer 2 is formed on the heterogeneous substrate 1 and the nitride semiconductor single crystal 4 is grown on the first nitride semiconductor single crystal layer 2, the 3D island growth does not occur and the crystal growth proceeds in step-flow mode all along. Due to this, the stress that occurs in the nitride semiconductor single crystal 4 can decrease and suppress the strain.

A thickness of the first nitride semiconductor single crystal layer 2 is preferable to be not less than 1 μm and not more than 10 μm. As the first nitride semiconductor single crystal layer 2 is made by hetero-epitaxially growing on the heterogeneous substrate 1, the 3D island growth occurs in early stage of the growing and it is needed to grow the layer 2 in a measure to make the surface a flat continuous film. If the thickness of the first nitride semiconductor single crystal layer 2 is less than 1 μm, a plurality of pits occur on the surface and it is difficult to grow the nitride semiconductor single crystal on the surface in step-flow mode. Also, if the thickness of the first nitride semiconductor single crystal layer 2 is more than 10 μm the template largely warps caused by a difference of a linear expansion coefficient between the heterogeneous substrate 1 and the first nitride semiconductor single crystal layer 2, it is not only hard to process grooving described in the next process but also, in a severe case, a crack occurs in the first nitride semiconductor single crystal layer 2.

Also, an upper surface of the first nitride semiconductor single crystal layer 2 grown on the heterogeneous substrate 1 is, for example, c-plane in a single crystal that configures the first nitride semiconductor single crystal layer 2 or a inclined plane from the c-plane within 5°. As the upper surface of the first nitride semiconductor single crystal layer 2 is the plane inclined from the c-plane, it is preferable that an offset angle (inclination angle) from the c-plane is within 5°. This is because, if the off-set angle is over 5°, an interface shape is distributed when the second nitride semiconductor single crystal layer 4 laterally grows and associates on the groove 3, and an abnormal growth and an ungrown region is easy to occur. The laterally growing of the second nitride semiconductor single crystal layer 4 is described later.

Next, as shown in FIG. 1C, the groove 3 is formed in the template 10 by applying the groove processing for the first nitride semiconductor single crystal layer 2 and the heterogeneous substrate 1. The groove 3 is configured by a plurality of linear grooves.

The groove 3 in the template 10 has a degree of a depth such that does not embed completely the second nitride semiconductor single crystal layer 4 when the second nitride semiconductor single crystal layer 4 is grown on the template 10, that is a depth so as to leave a gap after growing the second nitride semiconductor single crystal layer 4.

If the nitride semiconductor single crystal is grown on an unprocessed template 10, the stress occurs in the nitride semiconductor single crystal in an effort to resist the strain accumulated in the first nitride semiconductor single crystal layer 2. Here, the strain accumulated in the first nitride semiconductor single crystal layer 2 is distributed in almost six-fold symmetrical position for the central axis of the template 10 that reflects crystal symmetry of the first nitride semiconductor single crystal layer 2. Thus, the stress in the nitride semiconductor single crystal affected in an effort to resist this strain is also distributed in almost six-fold symmetrical position for the central axis of the template 10.

In the present embodiment, a pattern of the groove 3 formed on the surface of the template 10 have three-fold or six-fold rotational symmetry for the central axis of the template 10. Like this, as with the distribution of the strain accumulated in the first nitride semiconductor single crystal layer 2 described above, as the pattern of the groove 3 has rotational symmetry, the groove 3 can decrease the strain in the nitride semiconductor single crystal with releasing the stress in the nitride semiconductor single crystal caused by the strain of the first nitride semiconductor single crystal layer 2 without disturbing the crystallinity of the nitride semiconductor single crystal. Thus by forming the groove 3, the second nitride semiconductor single crystal layer 4 can be phase epitaxially grown on the template 10 while suppressing the crack grown. Below a specific example of the pattern of the groove 3 will be explained.

FIGS. 2A, 2B, 3A, 3B are top views showing an example of the pattern of the groove 3 formed on the template 10 respectively. The upper surfaces of the first nitride semiconductor single crystal layer 2 shown in FIGS. 2A, 2B, 3A, 3B are c-planes of the single crystal configuring the first nitride semiconductor single crystal layers 2 and the c-axes of the single crystals configuring the first nitride semiconductor single crystal layers 2 faces orthogonal to the space. The grooves 3 shown in FIGS. 2A, 2B, 3A, 3B have a latticed pattern that combines a plurality of lines and all grooves are connected.

Figure 2A:
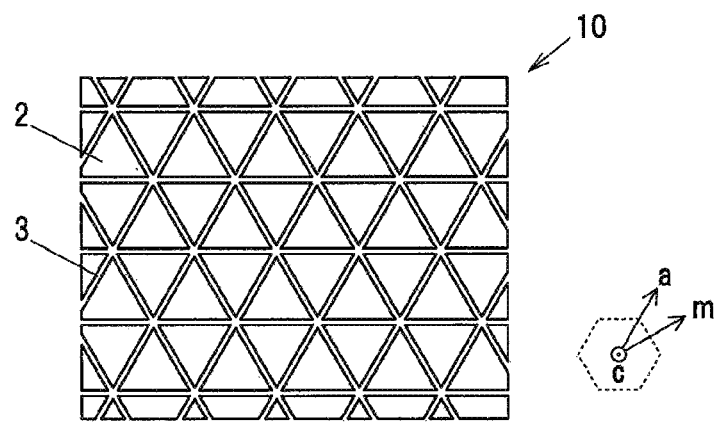
FIG. 2A is a top view showing an example of a pattern of a groove formed on a template.
Figure 2B:
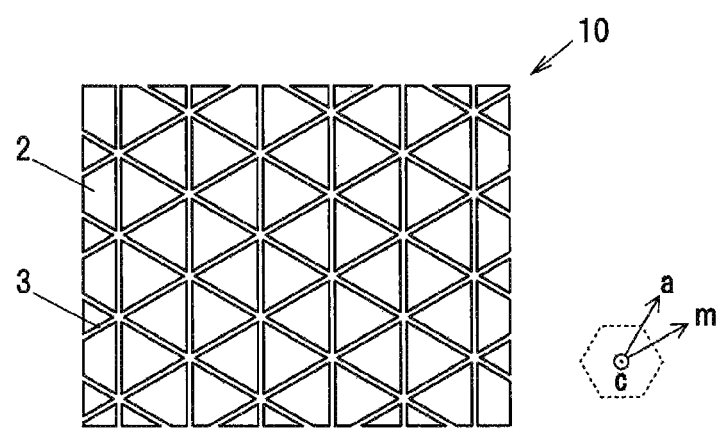
FIG. 2B is a top view showing an example of a pattern of a groove formed on a template.

The grooves 3 shown in FIGS. 2A, 2B have the latticed pattern that lines regular triangles. The groove 3 is formed such that a center of the one of the triangles included in the latticed pattern is located at the central axis of the template 10. Thus the pattern of the groove 3 shown in FIGS. 2A, 2B has three-fold rotational symmetry to the central axis of the template 10.

Figure 3A:
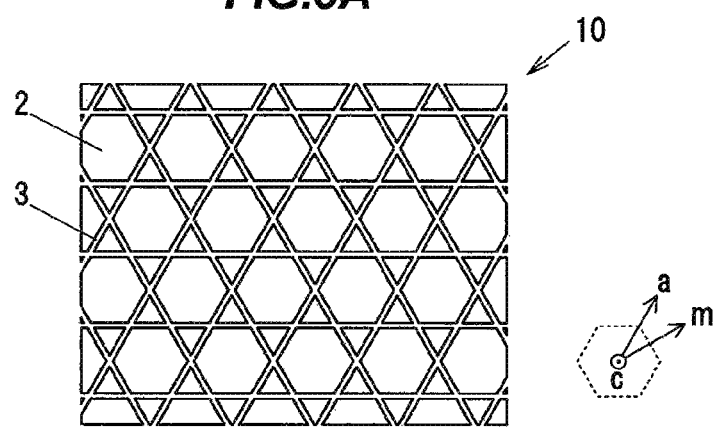
FIG. 3A is a top view showing an example of a pattern of a groove formed on a template.
Figure 3B:
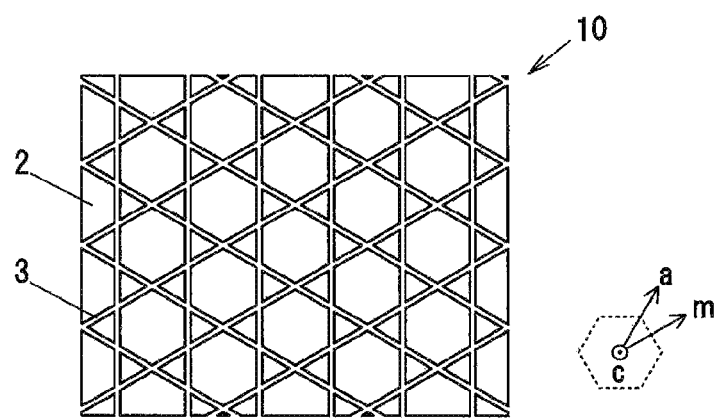
FIG. 3B is a top view showing an example of a pattern of a groove formed on a template.

The groove 3 shown in FIGS. 3A, 3B has the latticed pattern that lines regular hexagons and regular triangles. The groove 3 is formed such that the central of one of the regular hexagons included in the latticed pattern is formed such that located at the central axis of the template 10. Thus the pattern of the groove 3 has six-fold rotational symmetry to the central axis of the template 10.

The pattern of the groove 3 shown in FIG. 2A is configured by the combination of the lines parallel to the a-axis (orthogonal to the m-axis) of the single crystal configuring the first nitride semiconductor single crystal layer 2, the pattern of the groove 3 shown in FIG. 2B is configured by the combination of the lines parallel to the m-axis (orthogonal to the a-axis) of the single crystal configuring the first nitride semiconductor single crystal layer 2. For example, the width of the rectilinear groove is 50 µm, the depth is 300 µm, the pitch of the groove (the distance between the central of the adjacent grooves) is 1 mm.

The groove 3 shown in FIGS. 2A, 2B divides the first nitride semiconductor single crystal layer 2 into a plurality of almost equally dimensional regions (regular triangular region). By dividing the first nitride semiconductor single crystal layer 2 into a plurality of almost equally dimensional regions, convexity and concavity of the surface of the second nitride semiconductor single crystal layer 4 grown on the first nitride semiconductor single crystal layer 2 can be decreased and the second nitride semiconductor single crystal layer 4 can be grown smoothly, and in-plane uniformity of a characteristic of the nitride semiconductor single crystal substrate cut form the second nitride semiconductor single crystal layer 4 can be increased.

Meanwhile, depending on the growth condition in the HYPE method, it is possible to grow the second nitride semiconductor single crystal layer 4 while leaving the convexity and concavity on the growth interface corresponding to the shape of the region of the first nitride semiconductor single crystal layer 2 divided by the groove 3. The growth interface may have the convexity and concavity if the second nitride semiconductor single crystal layer 4 grows thickly while keeping the form of a continuous film. It may be effective to intentionally grow the second nitride semiconductor single crystal layer 4 with the convexity and concavity formed on the second nitride semiconductor single crystal layer 4 for purpose of controlling the distribution of the dislocation density in the crystal etc. If it is desired to grow crystal with forming large convexity and concavity, the groove 3 that has a pattern to divide the first nitride semiconductor single crystal layer 2 into different dimensional regions should be formed as shown in FIGS. 3A, 3B.

The groove 3 shown in FIGS. 3A, 3B divides the first nitride semiconductor single crystal layer 2 into differently dimensional two regions (regular hexagonal region and regular triangular region). If the second nitride semiconductor single crystal layer 4 grows on the template 10 shown in FIG. 3A, 3B, the growth interface of the large dimensional region (the hexagonal region in the example shown in FIGS. 3A, 3B) is lower than the growth interface of the small dimensional region (the triangular region in the example shown in FIGS. 3A, 3B) and the convexity and concavity is formed on the surface of the second nitride semiconductor single crystal layer 4. Like this, the convexity and concavity on the surface of second nitride semiconductor single crystal layer 4 can be controlled by the pattern of the groove 3.

The pattern of the groove 3 shown in FIG. 3A is configured by the combination of the lines parallel to the a-axis (orthogonal to the m-axis) of the nitride semiconductor single crystal of the first nitride semiconductor single crystal layer 2, the pattern of the groove 3 shown in FIG. 3B is configured by the combination of the lines parallel to the m-axis (orthogonal to the a-axis) of the nitride semiconductor single crystal of the first nitride semiconductor single crystal layer 2.

If the upper surface of the first nitride semiconductor single crystal layer 2 is c-plane, as shown in the FIGS. 2A, 2B, 3A, 3B, as the pattern of the groove 3 is configured by the combination of the lines parallel to the a-axis or the m-axis of the nitride semiconductor single crystal of the first nitride semiconductor single crystal layer 2 (the groove 3 is configured by a combination of the grooves parallel to the a-plane or the m-plane of the nitride semiconductor single crystal of the first nitride semiconductor single crystal layer 2), the nearby crystals are easy to combine smoothly with each other and can prevent leaving the ungrown region, and the crystal growth interface of the second nitride semiconductor single crystal layer 4 can be a flat continuous film without disturbing the step-flow growing mode when the second nitride semiconductor single crystal layer 4 covers upper of the groove 3 by laterally growing. The laterally growing of the second nitride semiconductor single crystal layer 4 is described later.

Also, if the heterogeneous substrate 1 is the sapphire substrate and, as shown in FIGS. 2A, 3A, the pattern of the groove 3 is configured by the combination of the lines parallel to the a-axis of the nitride semiconductor single crystal of the first nitride semiconductor single crystal layer 2, the rectilinear groove configuring the groove 3 becomes parallel to the easy cleavage surface of the sapphire, so that the strength of the bottom of the groove 3 in the heterogeneous substrate 1 decreases. Hereby, the crack is formed preferentially in the heterogeneous substrate 1 and it is easy to relax the strain when the strain caused by the difference of the linear expansion coefficient between the heterogeneous substrate 1 and the second nitride semiconductor single crystal layer 4 in the second nitride semiconductor single crystal layer 4.

Also, the pattern of the groove 3 is preferable to have periodicity. Hereby the time of the growing the second nitride semiconductor single crystal layer 4 that covers on the groove 3 is almost equal in the surface of the template 10 and the quality uniformity of the second nitride semiconductor single crystal layer 4 can be increased.

Also, if the groove 3 is formed by a plurality of rectilinear grooves in parallel, it is preferable that the grooves are arranged in parallel to each other at even intervals and the pitch between the central of each of the grooves is not less than 100 μm and not more than 10 mm, more preferably not more than 5 mm. If the pitch between the grooves is narrower than 100 μm, an association interface density exhibited when the second nitride semiconductor single crystal layer 4 laterally grows and associates at the upper part of the groove 3 increases, so that it is easy to change to the 3D island growth mode with the step-flow mode of the crystal growth broken. If the crystal growth mode changes to the 3D island growth mode, the strain remaining in the second nitride semiconductor single crystal layer 4 increases. On the other hand, if the pitch between the grooves is wider than 10 mm, a gap density remained in the heterogeneous substrate 1 decrease and the strain occurring in the second nitride semiconductor single crystal layer 4 cannot be released sufficiently.

The groove 3 is preferably formed by laser processing using a laser processing machine. Though the groove 3 can be formed by mechanical machining using a dice processing machine etc., by using the laser processing machine, the groove of which line width is narrower can be formed and a processing damage for the template 10 can be decreased. Moreover, by using the laser processing machine, the groove processing in the first nitride semiconductor single crystal layer 2 and the groove processing in the heterogeneous substrate 1 can be carried out in same process in forming the groove 3. If the depth of the groove 3 in the heterogeneous substrate 1 is not enough, it is easy to carry out the groove processing multiple times. As the laser processing machine, for example, a commercially available laser saw compliant with the ablation processing from DISCO.LTD can be used.

In forming the groove 3 using laser processing, an intersection point of the rectilinear grooves where the number of processing is many times is automatically processing deeply and a thin thickness region is formed at the intersection points forming a pointed pattern. Though the intersection point of the grooves may be a through hole, it is preferable not to be the through hole if it is not preferred that the source material gas comes around behind of the template 10 when the nitride semiconductor single crystal grows on the template 10. It is because that processing speed decrease caused by the heterogeneous substrate 1 is drawn heat for the base side of the processing machine contacting the heterogeneous substrate 1 when the hall of the intersection point becomes deeper in laser processing and processing interface approaches the behind of the template 10, making through hole can be suppressed by aligning laser strength.

In conducting the groove processing by the laser processing machine, an erosion product of the first nitride semiconductor single crystal layer 2 or the heterogeneous substrate 1 (for example, the erosion product of GaN or sapphire) is attached to an inside or a surround of the groove 3. To remove the erosion, it is preferable to etch the template 10 applied the groove processing by 1:1 mixed liquid of phosphoric acid and sulfuric acid, which are heated to about 220° C. in a few minutes and wash carefully by pure water. Using the heated mixed acid of phosphoric acid and sulfuric acid as an etchant, the erosion product of the first nitride semiconductor single crystal layer 2 that is easy to be a source of the abnormal growth of the nitride semiconductor crystal on the template 10 can be dissolved. In the case that the principal plane of the first nitride semiconductor single crystal layer 2 is c-plane, the c-plane (Ga polar plane) is strong for the etchant and the principal plane is not almost dissolved. However, since the erosion product of the second nitride semiconductor single crystal layer 2 is easy to dissolve, the erosion products can be etched and removed selectively. In the same manner, the erosion product of sapphire and thermal degeneration section can be dissolved and removed. However, about $10^9$ to $10^{10}$ per 1 $cm^2$ of threading dislocations exist in the first nitride semiconductor single crystal layer 2 grown on the heterogeneous substrate 1. Since even at the c-plane of the first nitride semiconductor single crystal layer 2, some etch pit can be formed by that the etching starts from a release end of the dislocation, it should not be etched for a long time. Meanwhile, it can be recommended to conduct the ultrasonic cleaning of the template 10 in the organic solvent or the pure water to remove the erosion product.

Also, by forming the groove 3 deeply and making the thickness of the heterogeneous substrate 1 just below the groove 3 thin, the configuration of the template 10 serves as a safety valve to relax the large strain caused by the difference of the linear expansion coefficient between the heterogeneous substrate 1 and the second nitride semiconductor single crystal layer 4 when the grown second nitride semiconductor single crystal layer 4 is cooled. That is to say, if the thickness of the heterogeneous substrate 1 just below the groove 3 is made to be thin enough as compared to the thickness of the second nitride semiconductor single crystal layer 4 such that the crack preferentially occurs in the heterogeneous substrate 1, it can relax the large strain caused by the difference of the linear expansion coefficient and prevent the second nitride semiconductor single crystal layer 4 from breaking.

By this way, in order to serve the configuration of the template 10 as the safety valve to relax the large strain caused by the difference of the linear expansion coefficient between the heterogeneous substrate 1 and the second nitride semiconductor single crystal layer 4, the thickness of the heterogeneous substrate 1 at a rectilinear region just below the groove 3 is preferably not more than 200 μm, more preferably not more than 100 μm. On the other hand, if the thickness of the heterogeneous substrate just below the groove 3 is too thin, the risk to break the heterogeneous substance 1 by handling in applying etching or washing, or in setting the heterogeneous substrate 1 into the furnace to grow the second nitride semiconductor single crystal layer 4 is increased. Thus, the thickness of the heterogeneous substrate just below the groove 3 is preferably not less than 50 μm. Meanwhile, as described above, when the groove 3 is formed by laser processing, especially thin thickness region of the heterogeneous substrate 1 is formed at the intersection point of the rectilinear grooves configuring the pointed pattern. The thickness of the heterogeneous substrate 1 at the region of the pointed pattern may be less than 50 μm.

And the thickness of the heterogeneous substrate 1 in the rectilinear region just below the groove 3 is preferable to be not more than one tenth of the thickness of the second nitride semiconductor single crystal layer 4 after the growth. To generate the crack preferentially in the heterogeneous substrate 1 without generating the crack in the second nitride semiconductor single crystal layer 4, the second nitride semiconductor single crystal layer 4 needs to have enough strength to the heterogeneous substrate 1. And the fact that this condition is fulfilled if the thickness of the second nitride semiconductor single crystal layer 4 is not less than one tenth of the thickness of the heterogeneous substrate 1 in the rectilinear region just below the groove 3 is evaluated empirically.

The strength of the template 10 that may become a problem in handling is determined by the thickness of the heterogeneous substrate 1 in the rectilinear region just below the groove 3. On the other hand, the region of the pointed pattern having weak mechanical strength of the heterogeneous substrate 1 formed by the laser processing becomes the origin when the heterogeneous substrate 1 is broken by the stress caused by the difference of the linear expansion coefficient between the heterogeneous substrate 1 and the second nitride semiconductor single crystal layer 4. Accordingly by arranging in addition to thin rectilinear wall part just below the groove 3 and the pointed pattern region with a wall part of less thickness than the thin linear wall part, the heterogeneous substrate 1 can be more likely to break in cooling the second nitride semiconductor single crystal layer 4 with partly keeping the strength against handling the heterogeneous substrate 1.

Meanwhile, the thin region in the pointed pattern may be arranged at a region excepting the intersection point section of the rectilinear grooves, it is especially easy to process at the intersection point section of the rectilinear groove and the substrate in-plane distribution of the strength in the heterogeneous substrate 1 can be uniform. Also though the region that the pointed pattern is thin may be formed by a process excepting the laser processing, it is especially easy to form using the laser processing.

Also, the depth of the groove 3 in the heterogeneous substrate 1 (the depth of the groove 3 excepting the thickness of the first nitride semiconductor single crystal layer 2) is preferable to be not less than three times the width of the groove 3 in the first nitride semiconductor single crystal layer 2. Whether the gap remains or not in the growth of the second nitride semiconductor single crystal layer 4 is determined by a competition between the growth speed in lateral direction on the groove 3 of the second nitride semiconductor single crystal layer 4 and the growth speed of the crystal from the bottom of the groove 3, and this is determined by the value of the ratio of the depth of the groove 3 in the heterogeneous substrate 1 to the width of the groove 3 in the first nitride semiconductor single crystal layer 2. If the value of the ratio is less than 3, the groove 3 is embedded by the high density nitride semiconductor crystal, and a sufficient sized gap does not remain in the heterogeneous substrate 1, and the strain in the second nitride semiconductor single crystal layer 4 cannot be released sufficiently by the gap.

The width of the rectilinear grooves configuring the groove 3 in the first nitride semiconductor single crystal layer 2 is preferably not less than 10 μm and not more than 100 μm. As described above, by laterally growing the second nitride semiconductor single crystal layer 4 on the first nitride semiconductor single crystal layer 2, it is important to cover the upper of the groove 3 and leave the gap into the heterogeneous substrate 1. However, if the width of the groove 3 in the first nitride semiconductor single crystal layer 2 is narrower than 10 μm, the groove 3 is covered in an early stage by a crystal grown from the side wall of the groove 3 and it is easy to be form the abnormal growth region on the groove 3. Also, if the width of the groove 3 in the first nitride semiconductor single crystal layer 2 is too narrow, it is hard to form accurately the deep groove 3 and the risk increases that the groove 3 does not sufficiently function as the groove in the present embodiment. On the other hands, if the width of the groove 3 in the first nitride semiconductor single crystal layer 2 is wider than 100 μm, the second nitride semiconductor single crystal layer 4 laterally grown cannot cover the upper of the groove 3 such that the ungrown region is likely grown in the second nitride semiconductor single crystal layer 4.

The rectilinear grooves configuring the groove 3 are preferably formed such that the width thereof in the first nitride semiconductor single crystal layer 2 is equal to the width thereof in the heterogeneous substrate 1. Although the width in the first nitride semiconductor single crystal layer 2 may be narrower than the width in the heterogeneous substrate 1, it is technically difficult to conduct the groove processing to have the groove shape. In contrast, if the width in the first nitride semiconductor single crystal layer 2 is wider than the width in the heterogeneous substrate 1, a crystal growth mode caused by exposing of the surface of the heterogeneous substrate 1 when the second nitride semiconductor single crystal layer 4 grows, which is different from the crystal growth mode on the first nitride semiconductor single crystal layer 2 occurs and it disturbs the crystalline property of the growing the second nitride semiconductor single crystal layer 4.

The pattern of the groove 3 may be, for example, a hexagonal patter, a diamond pattern, and a concentric circle pattern etc. Also the groove 3 may be configured by a lot of intermittent grooves. Also the depth and width of the groove 3 may be changed in the surface of the template 10. Also a part of the groove 3 may be through for the rear end of the template 10. Also the rear end of the heterogeneous substrate 1 may be processed the groove processing.

Next, as shown in FIG. 1D, the second nitride semiconductor single crystal layer 4 is epitaxially grown on the template 10 after the groove processing. The second nitride semiconductor single crystal layer 4 is made of the nitride semiconductor single crystal represented by the compositional formula $Al_YGa_{(1-Y)}N$ ($0 \leq Y \leq 1$). The second nitride semiconductor single crystal layer 4 is, for example, a Si doped GaN crystal layer with a thickness of 5 mm.

Since the second nitride semiconductor single crystal layer 4 needs to have a sufficient thickness for cutting the nitride semiconductor single crystal, it is preferably grown using the HYPE method of which the crystal growth speed is fast. Also, the HYPE method which grows a crystal in a reactor of a hot-wall configuration, comparing with the MOCVD method which grows a crystal in a reactor of a cold-wall configuration, even when a crystal is grown on the template 10 after the groove processing, has the merit that temperature distribution is less likely to be generated at the growth region in the substrate surface so as to have easily the uniform crystal growth. The GaN growth technology using the HPVE method is detailed in, e.g., JP-B-3553583. The technology for doping Si when GaN is grown using the HYPE method is detailed in, e.g., JP-B-3279528. Meanwhile, the second nitride semiconductor single crystal layer 4 may be grown using the liquid phase growth method such as the flux method or the ammonothermal method.

The first nitride semiconductor single crystal layer 2 and the second nitride semiconductor single crystal layer 4 preferably have the same composition. This is intended to prevent the occurrence of the strain and the defection in the second nitride semiconductor single crystal layer 4 caused by a lattice mismatch between the first nitride semiconductor single crystal layer 2 and the second nitride semiconductor single crystal layer 4.

The first nitride semiconductor single crystal layer 2 can be grown substantially undoped and the second nitride semiconductor single crystal layer 4 can be grown by doping impurities intentionally. Herein, "substantially undoped" means that any impurities are not doped intentionally. In the HYPE growth, even when not doping intentionally the impurities, Si and O caused by the quartz apparatus in the furnace are mixed into the crystal and the n-type crystal grows normally. The crystal that the impurities are not doped intentionally and that is grown with the impurity concentration as low as possible is herein defined as undoped crystal.

To grow flatly the thin first nitride semiconductor single crystal layer 2 on the heterogeneous substrate 1, the impurity concentration is preferably as low as possible. This is because the impurity atoms adsorbed on the growth interface prevent forming primary growth nucleuses of the nitride semiconductor so as to accelerate the 3D island growth, so that the crystal surface is hard to flatten. On the other hand, the impurity needs to be intentionally doped into the second nitride semiconductor single crystal layer 4 for cutting the nitride semiconductor single crystal substrate to make some kinds of devices so as to control the conductivity of the nitride semiconductor single crystal substrate. Si, S, Se, Ge, O, Fe, Mg, Zn etc. are commonly used as the impurity element doped into the nitride semiconductor single crystal substrate. Also, the impurity concentration required for the nitride semiconductor single crystal substrate is generally not less than $5 \times 10^{17}$ cm$^{-3}$, in case of large amount, not less than $1 \times 10^{18}$ cm$^3$.

However, in growing the crystal doped the impurities in high concentration on the undoped crystal, the strain caused by the difference of each of the lattice constants is generated, the crystal defect is generated and the crack is generated in the crystal. Accordingly, commonly relaxing a strain accumulated locally is taken measure by as amount of impurity doping increasing step by step, as the impurity concentration in the crystal increasing step by step from an undoped condition when the impurity doped crystal is grown. However, the substrate that is cut from the crystal that is thus grown has a problem that dispersion of the electric characteristic between the substrates is large or the substrate has a low yield rate caused by a region that does not satisfy the product specification, because the impurity concentration of the substrate is low at a region corresponding to the primary crystal growth.

On the other hand, in the present embodiment, the strain caused by the difference of the lattice constants between the undoped the first nitride semiconductor single crystal layer 2 and the second nitride semiconductor single crystal layer 4 doped impurities in high concentration can release by the gap in the groove 3 arranged in the template 10, the strain is not accumulated in the second nitride semiconductor single crystal layer 4. Accordingly, the second nitride semiconductor single crystal layer 4 doped impurities in high concentration can be grown directly on the undoped first nitride semiconductor single crystal layer 2.

The second nitride semiconductor single crystal layer 4 needs to have a certain degree of thickness for cutting the nitride semiconductor single crystal substrate in the next process. The free-standing nitride semiconductor single crystal substrate needs to have a thickness of at least 350 µm just after the slicing, for example where it has a diameter of 50 mm, to have a sufficient strength. In considering a margin for slicing, the thickness of the second nitride semiconductor single crystal layer 4 needs to be not less than 500 µm. Furthermore, since the dispersion in crystal direction and the dislocation density in the crystal can be improved according as the thickness of the crystal increases, it is advantageous to grow the second nitride semiconductor single crystal layer 4 thicker. Thus, the thickness of the second nitride semiconductor single crystal layer 4 is preferably not less than 500 µm, more preferably not less than 1 mm.

The second nitride semiconductor single crystal layer 4 grows laterally (or along the surface) on the first nitride semiconductor single crystal layer 2 of the template 10 and covers the opening of the groove 3. Hereby, a polycrystal or amorphous phase is left in the groove 3 that has a lower density, a lower mechanical strength than the gap and the second nitride semiconductor single crystal layer 4, and that has the same composition as the first nitride semiconductor single crystal layer 2. The polycrystal and amorphous phase are generated naturally caused by generating crystal nucleation in random direction on the sidewall section of the groove 3 in the groove 3 when the second nitride semiconductor single crystal layer 4 grows on the template 10 that has the groove 3. The gap, polycrystal and amorphous phase in the groove 3 can help deform the template 10 and relax the deformation in the second nitride semiconductor single crystal layer 4 when the growth of the second nitride semiconductor single crystal layer 4 progresses such that the deformation occurs in the second nitride semiconductor single crystal layer 4.

To prevent the occurrence of the gap and the ungrown region in the second nitride semiconductor single crystal layer 4 caused by the existence of the gap, polycrystal, and amorphous phase in the groove 3, it is important to grow laterally the second nitride semiconductor single crystal layer 4 on the upper of the groove 3 in early stage to cover the upper of the groove 3 by the second nitride semiconductor single crystal layer 4 by optimizing the growth condition of the second nitride semiconductor single crystal layer 4. If the gap or the ungrown region is formed in the second nitride semiconductor single crystal layer 4, the deformation is easy to generate in the second nitride semiconductor single crystal layer 4 and causes a breaking in processing. Also it may cause a through hole or a large pit in the nitride semiconductor single crystal substrate cut from the second nitride semiconductor single crystal layer 4, and it may be a factor that prevents the obtainment of a high quality nitride semiconductor single crystal substrate.

For example, if a GaN single crystal is grown as the second nitride semiconductor single crystal layer 4 using the HYPE method, the lateral growth becomes easy according as the surface temperature in the growing increases. Though it depends on the configuration of the furnace and the other crystal growth condition, for example, the lateral growth becomes easy when the surface temperature of the template 10 is not less than 1000° C., if possible not less than 1050° C. Also the lateral growth becomes easy when the V/III ratio of the material (i.e., a mole ratio of the group V material and the group III material that are supplied to the substrate) is low. Although it also depends on the configuration of the furnace and the other crystal growth condition, the lateral growth becomes easy, for example, when the V/III ratio is not more than 10, if possible not more than 5. Also the lateral growth becomes easy when as to the composition of the atmosphere gas in growing the hydrogen gas concentration is low and, if possible it is preferable to include no hydrogen gas in the material career gas. These are the desired growth conditions when growing laterally the second nitride semiconductor single crystal layer 4 on the groove 3, and the growth conditions may be changed once the crystal covers the upper of the groove 3.

Meanwhile, if the gap remains in the groove 3 after growing the second nitride semiconductor single crystal layer 4, it is preferable that all gaps are connected in the groove 3 of the heterogeneous substrate 1 and connected with the outer space of the heterogeneous substrate 1 through the opening of the groove 3 at the outer peripheral of the heterogeneous substrate 1. This is because if the gap in the groove 3 is a completely closed space, a stress to the second nitride semiconductor single crystal layer 4 can be caused since the volume of gas left in the gap is changed when the temperature of the second nitride semiconductor single crystal layer 4 rises and falls. If the pattern of the groove 3 is a pattern such as a latticed pattern that all grooves are connected, all gaps in the groove 3 can be connected to the external space of the heterogeneous substrate 1 through the opening of the groove 3 at the outer peripheral of the heterogeneous substrate 1. An approach may be used to leave intentionally the opening of the groove 3 on the front surface side of the template 10 by covering a part (preferably the outer peripheral region) of the front surface of the first nitride semiconductor single crystal layer 2 so as not to grow the second nitride semiconductor single crystal layer 4 only on that part when growing the second nitride semiconductor single crystal layer 4. If the ungrown region of the second nitride semiconductor single crystal layer 4 is disposed at the outer peripheral region of the front surface of the first nitride semiconductor single crystal layer 2, it is necessary to use the heterogeneous substrate 1 whose diameter is larger than the diameter of the objective nitride semiconductor single crystal substrate 5.

Also before growing the second nitride semiconductor single crystal layer 4, it is preferable that the template 10 in which the groove 3 is formed is etched or washed using such as acid or alkali so as to remove an extraneous material such as chips attaching to the front surface of the first nitride semiconductor single crystal layer 2 or the inside of the groove 3, or the thermal denaturation phase or the processing stress nearby the groove processing interface of the first nitride semiconductor single crystal layer 2. If the extraneous material, the thermal denaturation phase and the processing stress etc. remains when the second nitride semiconductor single crystal layer 4 grows, the crystal defection is likely to occur in the second nitride semiconductor single crystal layer 4. The etching is effective if it is carried out in a heated mixed liquid of phosphoric acid and sulfuric acid, which has an etching suitability for the GaN crystal. The heated mixed liquid of phosphoric acid and sulfuric acid can remove not only chips of the GaN but also chips of the sapphire or thermal denaturation phase.

Next, as shown in FIG. 1E, the nitride semiconductor single crystal substrate 5 is cut from the second nitride semiconductor single crystal layer 4. In cutting the second nitride semiconductor single crystal layer 4, a multi-wire saw generally used for cutting the Si or GaAs crystal can be used. A technology for cutting the GaN crystal using the multi-wire saw is disclosed in, for example, JP-A-2013-032778. Also, prior arts such as an inner peripheral blade slicer, an outer peripheral blade slicer, a (multi-)wire saw, and a wire electric discharge processing machine can be used therefor. Since a saw-mark or processing deformation is often left on the cut surface of the nitride semiconductor substrate single crystal 5, it is preferable to polish the front and rear surfaces of the nitride semiconductor substrate single crystal 5 after the cutting so as to remove the saw-mark or processing deformation.

Here, in order to prevent the breaking of the crystal when the nitride semiconductor single crystal substrate 5 is cut, it is preferred that, before the cutting process of the crystal, as described above, a region with a thickness of not less than 5 mm at the crystalline outer periphery including a non c-plane growth region is removed (not shown). When the second nitride semiconductor single crystal layer 4 grows on the template 10 with a front surface of c-plane, the surface of a most region of the second nitride semiconductor single crystal layer 4 is also of c-plane. However, the region (i.e., non c-plane growth region) that the crystal growth interface is not of c-plane is formed at the outer periphery. It is proved that the non c-plane growth region has a difference in introduction efficiency of the impurity atoms as comparing with the growth region that the growth interface is of the c-plane. The deformation caused by the difference of the impurity concentration is generated nearby the interface between the non c-plane growth region and the c-plane growth region. Thus, removing the non c-plane growth region before the step of cutting the nitride semiconductor single crystal substrate from the second nitride semiconductor single crystal layer 4 is effective to prevent the occurrence of the crack when the second nitride semiconductor single crystal layer 4 is sliced. By removing the outer periphery with a thickness of not less than 5 mm of the second nitride semiconductor single crystal layer 4, the deformation accumulated region can be removed effectively. As the method for removing the outer periphery of the second nitride semiconductor single crystal layer 4, a method such as grind processing or electric discharge processing can be used. When removing the outer periphery of the second nitride semiconductor single crystal layer 4 with a thickness of not less than 5 mm, it is necessary to use the heterogeneous substrate 1 that has a diameter of 10 mm larger than the diameter of the objective the nitride semiconductor single crystal substrate 5.

To remove the crystalline outer periphery, it is preferable to use e.g., the technology that is disclosed in PCT/JP2014/051806. Specifically, the outer periphery of the second nitride semiconductor single crystal layer 4 is ground and removed using e.g., a cup type grindstone with an inner diameter of 52 mm. Then, six nitride semiconductor single crystal substrates 5 with a thickness of 500 μm are cut using the multi-wire saw. However, the crystal is not always broken unless the crystalline outer periphery is removed. Thus, the removal of the crystalline outer periphery is not essential. As described later, if a part of the nitride semiconductor single crystal substrate 5 is used as a seed crystal of the other nitride semiconductor single crystal, the outer periphery of a lower region of the nitride semiconductor single crystal substrate 5 where the seed crystal is cut may not be removed so as not to decrease the diameter. Instead, only the outer periphery of an upper region except that region may be removed.

A plurality of the nitride semiconductor single crystal substrate 5 can be cut from the second nitride semiconductor single crystal layer 4. Also, by cutting intentionally with the cutting surface inclined from the surface orthogonal to the crystal growth direction, it is easy to obtain the nitride semiconductor single crystal substrate 5 that is off-angled. To obtain the off-angled nitride semiconductor single crystal substrate 5, it is possible to use the heterogeneous substrate 1 that is off-angled as the base. However it is hard to cover finely the groove 3 by the second nitride semiconductor single crystal layer 4 according as the off-angle increases. Thus, it is preferable to grow the second nitride semiconductor single crystal layer 4 as the c-plane without using the off-angled heterogeneous substrate 1. Also, it is possible to polish diagonally to add the off-angle after cutting at the c-plane the second nitride semiconductor single crystal layer 4 that is grown with the c-plane. However the cost of processing the second nitride semiconductor single crystal layer 4 increases and it is inefficient. By cutting diagonally the second nitride semiconductor single crystal layer 4 that is grown with the c-plane, the plural nitride semiconductor single crystal substrates 5 that are off-angled can be cut on demand and the crystal is not wasted. In this case, to cut the plurality nitride semiconductor single crystal substrates 5 in parallel from the one second nitride semiconductor single crystal layer 4 is the most efficient way. However the cutting angle may be changed for each of the substrates on demand. For example, after cutting with the c-plane the nitride semiconductor single crystal substrate 5 to be used as the seed crystal from the second nitride semiconductor single crystal layer 4, it is possible to slice the rest of the second nitride semiconductor single crystal layer 4 to be off-angled.

For example, the cut nitride semiconductor single crystal substrate 5 is beveled along the outer periphery and the front and rear surface are mirror polished. Finally, the GaN substrate with a diameter of 50.8 mm and a thickness of 400 μm is wrapped up.

Meanwhile, before cutting the nitride semiconductor single crystal substrate 5 from the second nitride semiconductor single crystal layer 4, a flat region that becomes orientation flat (OF) or index flat (IF) may be formed at the outer periphery of the second nitride semiconductor single crystal layer 4. Also, in cutting the nitride semiconductor single crystal substrate 5 from the second nitride semiconductor single crystal layer 4, the cutting surface may be made to be a surface except the c-plane, such as m-plane, a-plane and r-plane.

[Second Embodiment]

The second embodiment is characterized by that a nitride semiconductor single crystal substrate is cut from a third nitride semiconductor single crystal layer that is homo-epitaxially grown on the nitride semiconductor single crystal substrate 5 obtained in the first embodiment.

Figure 4A:
FIG. 4A is a vertical cross sectional view showing schematically a step for manufacturing a nitride semiconductor single crystal substrate in a second embodiment.
Figure 4B:
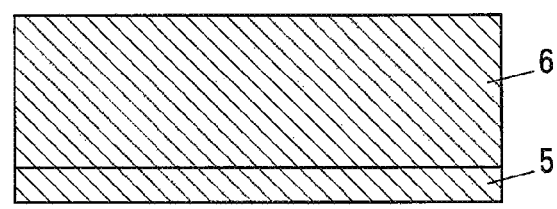
FIG. 4B is a vertical cross sectional view showing schematically a step for manufacturing the nitride semiconductor single crystal substrate in the second embodiment.
Figure 4C:
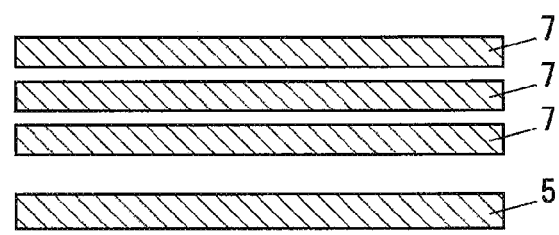
FIG. 4C is a vertical cross sectional view showing schematically a step for manufacturing the nitride semiconductor single crystal substrate in the second embodiment.

FIGS. 4A to 4C are vertical cross sectional views showing schematically steps for manufacturing a nitride semiconductor single crystal substrate in the second embodiment.

First, as shown in FIG. 4A, the nitride semiconductor single crystal substrate 5 obtained in the first embodiment is provided. Next, as shown in FIG. 4B, the third nitride semiconductor single crystal layer 6 is homo-epitaxially grown thickly on the nitride semiconductor single crystal substrate 5. Next, as shown in FIG. 4C, the nitride semiconductor single crystal substrate 7 is cut from the third nitride semiconductor single crystal layer 6. Below, the configurations of the each of the processes will be explained in detail.

First, as shown in FIG. 4A, the nitride semiconductor single crystal substrate 5 obtained in the first embodiment is provided as the seed crystal. The nitride semiconductor single crystal substrate 5 has a characteristic that the dispersion of crystalline orientation distribution in the surface of the substrate is very small as comparing to that of the nitride semiconductor single crystal substrate obtained by the conventional hetero-epitaxial growth. Thus, when the nitride semiconductor single crystal layer is homo-epitaxially grown on the nitride semiconductor single crystal substrate 5 that is used as the seed crystal, the high quality nitride semiconductor single crystal can be obtained since the strain caused by the dispersion of orientation distribution the conventional seed crystal is not generated in the grown crystal layer.

Though the nitride semiconductor single crystal substrate 5 may be cut from any position of the second nitride semiconductor single crystal layer 4, the substrate cut from the position closer to the top surface of the second nitride semiconductor single crystal layer 4 is preferable since is small in the dispersion of the crystal orientation and low in the dislocation density.

The surface of the nitride semiconductor single crystal substrate 5 is preferably previously mirror polished and etched to remove the processing strain. However, when the nitride semiconductor single crystal substrate 5 is used that is cut from an outermost surface of the second nitride semiconductor single crystal layer 4, it may be used in as-grown state with the surface not mirror polished.

The as-grown growth surface often exhibits a form that reflects the temperature distribution of the crystal growth apparatus and the character of the source material gas flow, and is not subjected to the accumulation of processing strain caused by polishing etc. Thus, when the crystal growth of the third nitride semiconductor single crystal layer 6 is conducted in the same furnace as used for growing the second nitride semiconductor single crystal layer 4, the growth of the third nitride semiconductor single crystal layer 6 can be started in more natural form by using the as-grown growth surface of the second nitride semiconductor single crystal layer 4 as the seed crystal. Also, since the as-grown growth surface is generally a part that should be removed in processing the substrate, the efficiency of utilization can be increased if the surface is reused.

Next, as shown in FIG. 4B, the third nitride semiconductor single crystal layer 6 is homo-epitaxially grown thickly on the nitride semiconductor single crystal substrate 5. In growing the third nitride semiconductor single crystal layer 6, the technology used for the growth of the second nitride semiconductor single crystal layer 4 in the first embodiment can be used.

Since the third nitride semiconductor single crystal layer 6 is grown on the flat nitride semiconductor single crystal substrate 5 that has no convexity and concavity, the lateral growth conditions for covering the groove in the surface of the seed crystal such as the second nitride semiconductor single crystal layer 4 are not necessary. Thus, the freedom degree for setting the crystal growth condition is high. However, since there is no mechanism for releasing a strain toward the base side when it occurs in the third nitride semiconductor single crystal layer 6, it is preferable to reconcile the impurity concentration between the nitride semiconductor single crystal substrate 5 and the third nitride semiconductor single crystal layer 6 to prevent the occurrence of the strain.

Next, as shown in FIG. 4C, the nitride semiconductor single crystal substrate 7 is cut from the third nitride semiconductor single crystal layer 6. In cutting and subsequently processing the nitride the semiconductor single crystal substrate 7, the technology used for cutting and subsequently processing the nitride semiconductor single crystal substrate 5 in the first embodiment can be used.

The nitride semiconductor single crystal substrate 5 as the seed crystal that is left after cutting the nitride semiconductor single crystal substrate 7 can be used repeatedly as the seed crystal by being etched to remove the processing strain after the surface is mirror polished, or can be also used as the nitride semiconductor single crystal substrate. Moreover, the nitride semiconductor single crystal substrate 7 cut from the third nitride semiconductor single crystal layer 6 can be used anew as the seed crystal for the nitride semiconductor single crystal growth. Thus, by repeating the change of generation of the seed crystal, the high quality nitride semiconductor single crystal substrate having less crystal defection can be obtained.

However, as described in the first embodiment, to remove the outer periphery of the nitride semiconductor single crystal layer before cutting the substrate may cause a problem that the diameter of the seed crystal decreases every time the generation progresses. Thus, by removing the outer periphery from the opposite side of the growth surface of the nitride semiconductor single crystal layer without removing only a part of the outer periphery that is cut for the seed crystal, the substrate that has the as-grown growth interface with the crystal diameter not changed can be cut as the seed crystal every time.

By the same method as in cutting the nitride semiconductor single crystal substrate 5 in the first embodiment, the plural nitride semiconductor single crystal substrates 7 can be cut from the third nitride semiconductor single crystal layer 6. Also, the third nitride semiconductor single crystal layer 6 can cut intentionally with the cutting surface inclined from the surface orthogonal to the crystal growth direction.

Meanwhile, before cutting the nitride semiconductor single crystal substrate 7 from the third nitride semiconductor single crystal layer 6, a flat region that becomes orientation flat (OF) or index flat (IF) may be formed at the outer periphery of the third nitride semiconductor single crystal layer 6. Also, in cutting the nitride semiconductor single crystal substrate 7 from the third nitride semiconductor single crystal layer 6, the cutting surface may be a surface except the c-plane, such as m-plane, a-plane and r-plane.

(Effects of the Embodiment)

According to the first embodiment described above, the breaking of the nitride semiconductor single crystal layer 4 in the processing can be prevented by releasing the strain in the nitride semiconductor single crystal layer 4 grown on the heterogeneous substrate 1. Thus, the high quality nitride semiconductor single crystal substrate 5 can be obtained efficiently.

These effects become larger in the manufacturing the crystal substrate with the large diameter. For example, the first embodiment is so effective if the diameter of the heterogeneous substrate 1 is not less than 50 mm, more effective if the diameter of the heterogeneous substrate 1 is not less than 100 mm, further effective if the diameter of the heterogeneous substrate 1 is not less than 150 mm.

Also, according to the second embodiment, the higher quality nitride semiconductor single crystal substrate 7 can be formed by using the nitride semiconductor single crystal substrate 5 obtained in the first embodiment as the seed crystal.

Examples of nitride semiconductor single crystal substrates manufactured based on the above embodiments will be described below as well as evaluations thereof.

EXAMPLE 1

As the heterogeneous substrate 1, a commonly available single crystal sapphire c-plane substrate having a diameter of 65 mm and a thickness of 400 μm is used, and the template 10 is obtained by growing undoped GaN layer as the first nitride semiconductor single crystal layer 2 on the single crystal sapphire c-plane substrate by the MOCVD method. As materials of the undoped GaN layer, TMG (Tri-methyl gallium) and $NH_3$ are used.

A growth pressure is ordinary pressure. First, after the heterogeneous substrate 1 is performed a thermal cleaning in hydrogen gas atmosphere at 1200° C. for 10 minutes, a substrate temperature is decreased to 600° C. and a lower-temperature buffer layer is grown by 20 nm. Next, the substrate temperature is increased to 1050° C. and an undoped GaN layer is grown by 2 μm. Mixed gas of hydrogen and nitrogen is used as career gas. A crystal growth speed is about 4 μm/h. After crystal growing, the template 10 is taken out from the furnace and it is confirmed that a flat continuous film without pit etc. is obtained by viewing a surface of the first nitride semiconductor single crystal layer 2 using an optical microscope.

Next, the groove 3 is formed on the surface of the obtained template 10 using a commonly available laser processing machine. A pattern of the groove 3 is as shown in FIG. 2A. Plural rectilinear grooves configuring the groove 3 have a width of 50 μm, a depth of 300 μm, and a pitch of 1 mm (i.e., a distance between centers of neighboring grooves) between the parallel grooves. The depth of the groove 3 is automatically deepened at an intersection point of the rectilinear grooves where the number of laser processing is accumulated and the deepest place reaches about 360 μm.

Next, the template 10 is etched in a 1:1 mixed liquid of phosphoric acid and sulfuric acid heated at 220° C. for 10 minutes with the intent to remove powdery erosion products of the GaN and the sapphire that attaches to an inside or an around of the groove 3 in groove processing by the laser processing machine. Then, the template 10 is washed carefully by flowing pure water and dried after ultrasonic washing in methyl alcohol.

Next, the Si doped GaN crystal that becomes as the second nitride semiconductor single crystal layer 4 having a thickness of 5 mm is homo-epitaxially grown on the template 10 in which the groove 3 is formed using the HYPE method. In the HYPE growth, supplying as a source material GaCl produced by contacting HCl gas to Ga metal heated to 800° C. and $NH_3$, and as a dopant gas hydrogen diluted $SiH_2Cl_2$ gas onto the template 10 heated at 1060° C., the Si doped GaN crystal is grown. A furnace pressure in the growth is ordinary pressure. A composition of career gas is nitrogen 95% and hydrogen 5%. V/III ratio of the source material gas is 4. The crystal in the growth is rotated at 5 rpm and the growth speed of the GaN crystal is 250 to 300 μm/h. The target career concentration of the growth crystal is $1 \times 10^{18}$ $cm^{-3}$.

Thus, when the second nitride semiconductor single crystal layer 4 is grown and taken out from the furnace after cooling, the GaN crystal is obtained that has a thickness in the central region of 5.1 mm. An appearance of the crystal shows no sign that exhibits the occurrence of a deep pit, a crack or an abnormal growth, and it is conformed that the front surface of the crystal is mostly flat and smooth although a minute convexity and concavity reflecting the pattern of the groove 3 arranged in the template 10 is found.

Next, the GaN substrate as the nitride semiconductor single crystal substrate 5 is cut from the second nitride semiconductor single crystal layer 4, that is, the GaN crystal having the thickness of 5.1 mm grown on the template 10 in this way. First, before cutting the second nitride semiconductor single crystal layer 4, an outer periphery of the second nitride semiconductor single crystal layer 4 is ground and removed using a cup-shaped diamond electroplated grinding wheel that has an inner diameter of 52 mm Next, the second nitride semiconductor single crystal layer 4 that is formed into an outer diameter of 52 mm is pasted on a pedestal for a slice processing, and cut orthogonal to the crystal growth direction using multi-wire saw and then the nitride semiconductor single crystal substrate 5 that has the thickness of 500 μm is obtained. In the removing and cutting processes of the outer periphery of the second nitride semiconductor single crystal layer 4, there is no crack generated in the second nitride semiconductor single crystal layer 4. Thus, the six nitride semiconductor single crystal substrates 5 are obtained.

The obtained nitride semiconductor single crystal substrate 5 is subjected to the OF, IF processing to the outer periphery, and then chamfering and shaping to have a diameter of 50.8 mm, using a beveling machine. Also the front and rear surfaces of the nitride semiconductor single crystal substrate 5 are lapped and polished, and finally formed into a mirror substrate that has a diameter of 400 μm. In the polishing, no defection such as a crack in the nitride semiconductor single crystal substrate 5 during the processing is found.

At the center of the mirror polished nitride semiconductor single crystal substrate 5, when an angle between the c-axis and the surface of the substrate is measured using the x-ray diffraction method, the angle is 0.00°. Also by carrying out the same measurement at eight points in total that is arranged at every ±5 mm from the center of the nitride semiconductor single crystal substrate 5 on the diameter of the substrate, when the dispersion of the nine measurement results in total is researched, the dispersion is very small and the difference between the maximum measurement and the minimum measurement is about 0.05°.

Also, when the dislocation density of the nitride semiconductor single crystal substrate 5 cut from the outermost surface side of the second nitride semiconductor single crystal layer 4 is evaluated by the scotoma density confirmed by the cathode luminescence, it is confirmed that is in the range from 5 to $7 \times 10^7$ cm$^{-2}$ in the measurement at nine points on the surface.

COMPARATIVE EXAMPLE 1

When the Si doped GaN crystal is grown on the template 10 without forming the groove 3 by the similar condition to Example 1 using the HYPE method, the crack is generated when a thickness of the GaN crystal is not less than 20 μm, and the GaN crystal that has a thickness enough to cut the GaN substrate cannot be obtained at all.

COMPARATIVE EXAMPLE 2

The GaN single crystal substrate is made by the VAS method that is disclosed in JP-A-2001-176813 that is the prior art. First, a commonly available single crystal sapphire c-plane substrate that has a diameter of 65 mm and a thickness of 400 μm is used, and a template is obtained by growing the undoped GaN layer that has a thickness of 500 nm on the single crystal sapphire c-plane substrate using the MOCVD method. As source materials for the undoped GaN layer, TMG and NH$_3$ are used.

Next, a metallic Ti film is vacuum deposited to a thickness of 30 nm on the template, put into the MOCVD furnace and subjected to heating treatment at 1050° C. in 30 minutes in a mixed gas flow of hydrogen 80% and NH$_3$ 20%. Thereby, the metallic Ti film is deformed into mesh-like one and nitrided, so that the mesh-like TiN film is formed. Also numbers of gaps are generated in the GaN layer under the TiN film.

Thus the prepared base substrate is put into the HYPE furnace and the Si doped GaN crystal is grown on the base substrate by the similar condition to Example 1 described above to a thickness of 2 mm Although a growth experiment is tried several times, because the crack occurs when a thickness of the GaN crystal is over 3 mm, the growth is stopped when the thickness of the GaN crystal reaches 2 mm in consideration of a margin. After the growth is stopped, the GaN crystal that is cooled and put out from the HYPE furnace is peeled off naturally as with a characteristic of the VAS method. I is conformed that the obtained free-standing substrate shaped GaN crystal curves downwardly convex direction even in visual observation.

Thus the obtained GaN crystal is hollowed out by a diameter of 52 mm as with Example 1, cut by the wire-saw and two GaN substrates that have a thickness of 500 μm are obtained. A substrate that is obtained from the upper surface side of the GaN crystal from two GaN substrates is broken with the crack when the substrate is cut. The GaN substrate that is obtained from the bottom surface side of the GaN crystal that is not broken and left is applied outline processing and polish processing as with Example 1 and the GaN mirror substrate that has a diameter of 50.8 mm and a thickness of 400 μm is obtained finally.

When the dispersion of the angle between the c-axis in the obtained GaN mirror substrate and the surface of the substrate is measured by using the method as with Example 1, the difference between the maximum measurement and the minimum measurement is 0.23°. Also, when the dislocation density of the substrate cut from the outermost surface side of the GaN crystal is evaluated by the scotoma density confirmed by the cathode luminescence, it is confirmed that is in the range from 1 to $6 \times 10^6$ cm$^{-2}$ in the measurement at nine points on the surface.

EXAMPLE 2

As the heterogeneous substrate 1, a commonly available single crystal sapphire c-plane substrate having a diameter of 120 mm and a thickness of 700 μm is used, and the template 10 is obtained by growing undoped GaN layer as the first nitride semiconductor single crystal layer 2 on the single crystal sapphire c-plane substrate by the MOCVD method. As source materials for the undoped GaN layer, TMG (Tri-methyl gallium) and NH$_3$ are used.

A growth pressure is ordinary pressure. First, after the heterogeneous substrate 1 is performed thermal cleaning in hydrogen gas atmosphere at 1200° C. for 10 minutes, a substrate temperature is decreased to 600° C. and a lower-temperature buffer layer is grown by 20 nm Next, the substrate temperature is increased to 1050° C. and an undoped GaN layer is grown by 2 μm. Mixed gas of hydrogen and nitrogen is used as career gas. A crystal growth speed is about 4 μm/h. After the crystal growth, the template 10 is taken out from the furnace and it is confirmed that flat continuous film without pit etc. is obtained by viewing a surface of the first nitride semiconductor single crystal layer 2 using an optical microscope.

Next, the groove 3 is formed on the surface of the obtained template 10 using a commonly available laser processing machine. A pattern of the groove 3 is as shown in FIG. 2B. Plural rectilinear grooves configuring the groove 3 have a width of 70 μm, a depth of 520 μm, and a pitch of 2 mm (i.e., a distance between centers of neighboring grooves) between the parallel grooves.

Next, the template 10 on which the groove 3 is formed is subjected to the etching and washing process in similar manner to Example 1, then the Si doped GaN crystal that has a thickness of 5 mm as the second nitride semiconductor single crystal layer 4 is homo-epitaxially grown on the template 10 by using the HYPE method. In the HYPE growth, a region in which the GaN is not grown is arranged intentionally at the most outer periphery of the template 10 by setting as a mask a plate that is made of SiC coated graphite and has a hole of 115 mm in inner diameter on the surface of the template 10. The other HYPE growth conditions are similar to Example 1.

Thus when the second nitride semiconductor single crystal layer 4 is grown and taken out from the furnace after cooling, the region that is under the mask of the template 10 is confirmed to be without the GaN crystal attached, and the GaN crystal that has an outer Diameter of 115 mm, a thickness in the central region of 5.0 in the region that has a diameter of 120 mm can be grown. An appearance of the GaN crystal shows, similarly to Example 1, no sign that exhibits the occurrence of a crack or abnormal growth, and any deep pit etc. is not observed on the surface of the crystal.

Next, the GaN substrate as the nitride semiconductor single crystal substrate 5 is cut from the obtained second nitride semiconductor single crystal layer 4. First, before cutting the second nitride semiconductor single crystal layer 4, an outer periphery of the second nitride semiconductor single crystal layer 4 is ground and removed using a cup-shaped diamond electroplated grinding wheel that has an inner diameter of 105 mm Next, the second nitride semiconductor single crystal layer 4 that is formed into an outer diameter of 105 mm is pasted on a pedestal for a slice processing, and cut in the surface that is inclined at 0.5° from the orthogonal direction to the crystal growth direction forward the m-axis using multi-wire saw and then the nitride semiconductor single crystal substrate 5 that has the thickness of 900 μm is obtained. In the removing process of the outer periphery of the second nitride semiconductor single crystal layer 4 and the cutting process, there is no crack generated in the second nitride semiconductor single crystal layer 4. Thus, the four nitride semiconductor single crystal substrates 5 are obtained.

The obtained nitride semiconductor single crystal substrate 5 is subjected to the OF, IF processing to the outer periphery, and chamfering and shaping to have a diameter of 100 mm, using a beveling machine. Also the front and rear surfaces of the nitride semiconductor single crystal substrate 5 are lapped and polished, and finally formed into a mirror substrate that has a diameter of 800 μm. In the polishing, no defection such as a crack in the nitride semiconductor single crystal substrate 5 during the processing is found.

At the center of the mirror polished nitride semiconductor single crystal substrate 5, when an angle between the c-axis and the surface of the substrate is measured using the x-ray diffraction method, the angle is 0.51°. Also by carrying out the same measurement at eight points in total that is arranged at every ±10 mm from the center of the nitride semiconductor single crystal substrate 5 on the diameter of the substrate along with the direction that the c-axis inclines, when the dispersion of the nine measurement results in total is researched, the dispersion is very small and the difference between the maximum measurement and the minimum measurement is 0.09.

EXAMPLE 3

As the heterogeneous substrate 1, a commonly available single crystal sapphire c-plane substrate having a diameter of 165 mm and a thickness of 900 μm is used, and the template 10 is obtained by growing undoped GaN layer as the first nitride semiconductor single crystal layer 2 on the single crystal sapphire c-plane substrate by the MOCVD method. As source materials of the undoped GaN layer, TMG (Tri-methyl gallium) and $NH_3$ are used.

A growth pressure is ordinary pressure. First, after the heterogeneous substrate 1 is performed thermal cleaning in hydrogen gas atmosphere at 1200° C. for 10 minutes, a substrate temperature is decreased to 600° C. and a lower-temperature buffer layer is grown by 20 nm Next, the substrate temperature is increased to 1050° C. and an undoped GaN layer is grown by 1.5 μm. Mixed gas of hydrogen and nitrogen is used as career gas. A crystal growth speed is about 3 μm/h. After the crystal growth, the template 10 is taken out from the furnace and it is confirmed that flat continuous film without pit etc. is obtained by viewing a surface of the first nitride semiconductor single crystal layer 2 using an optical microscope.

Next, the groove 3 is formed on the surface of the obtained template 10 using a commonly available laser processing machine. A pattern of the groove 3 is as shown in FIG. 3A. Plural rectilinear grooves configuring the groove 3 have a width of 100 μm, a depth of 700 μm, and a pitch of 2.4 mm (i.e., a distance between centers of neighboring grooves) between the parallel grooves.

Next, the template 10 is etched in 1:1 mixed liquid by phosphoric acid and sulfuric acid heated at 220° C. for 10 minutes with the intent to remove powdery erosion products of the GaN and the sapphire that attaches to an inside or an around of the groove 3 in groove processing by the laser processing machine. Then, the template 10 is washed carefully by flowing pure water and dried after ultrasonic washing in methyl alcohol.

Next, the Si doped GaN crystal that becomes as the second nitride semiconductor single crystal layer 4 having a thickness of 3 mm is homo-epitaxially grown on the template 10 in which the groove 3 is formed using the HYPE method. In the HYPE growth, supplying as a source material GaCl produced by contacting HCl gas to Ga metal heated to 800° C. and $NH_3$ as material, and as a dopant gas hydrogen diluted $SiH_2Cl_2$ gas onto the template 10 heated at 1050° C., the Si doped GaN crystal is grown. A furnace pressure in the growth is ordinary pressure. A composition of career gas is nitrogen 95% and hydrogen 5%. V/III ratio of the source material gas is 2. The crystal in the growth is rotated at 5 rpm and the growth speed of the GaN crystal is 200 to 250 μm/h. The target career concentration of the growth crystal is $5 \times 10^{18}$ $cm^3$.

Thus when the second nitride semiconductor single crystal layer 4 is grown and taken out from the furnace after cooling, the GaN crystal that has the thickness in the central region of 3.0 mm is obtained. An appearance of the crystal shows no sign that exhibits the occurrence of a deep pit, a crack or an abnormal growth, and it is confirmed that the front surface of the crystal is mostly flat and smooth although a minute convexity and concavity reflecting the pattern of the groove 3 arranged in the template 10 is found.

Next, the GaN substrate as the nitride semiconductor single crystal substrate 5 is cut from the second nitride semiconductor single crystal layer 4, that is, the GaN crystal grown on the template 10. First, before cutting the second nitride semiconductor single crystal layer 4, an outer periphery of the second nitride semiconductor single crystal layer 4 is ground and removed using a cup-shaped diamond electroplated grinding wheel that has an inner diameter of 155 mm Next, the front surface side of the second nitride semiconductor single crystal layer 4 that is formed into an outer diameter of 155 mm is pasted on a pedestal for a slice processing, and cut orthogonal to the crystal growth direction using the electric discharge machine and then the nitride semiconductor single crystal substrate 5 that has the thickness of 1200 μm is obtained. In the removing and cutting processes of the outer periphery of the second nitride semiconductor single crystal layer 4 and the cutting process, there is no crack generated in the second nitride semiconductor single crystal layer 4 and two nitride semiconductor single crystal substrates 5 are obtained.

The obtained nitride semiconductor single crystal substrate 5 is subjected to a notch processing to the outer periphery, and then chamfering and shaping to have a diameter of 50.8 mm using a beveling machine. Also the front and rear surfaces of the nitride semiconductor single crystal substrate 5 are lapped and polished, and finally formed into a mirror substrate that has a diameter of 500 μm. In the polishing, no defection such as a crack in the nitride semiconductor single crystal substrate 5 during the processing is found.

At the center of the mirror polished nitride semiconductor single crystal substrate 5, when an angle between the c-axis and the surface of the substrate is measured using the x-ray diffraction method, the angle is 0.02°. Also by carrying out the same measurement at six points in total that is arranged at every ±20 mm from the center of the nitride semiconductor single crystal substrate 5 on the diameter of the substrate along with the direction that the c-axis inclines, when the dispersion of the seven measurement results in total is researched, the dispersion is very small and the difference between the maximum measurement and the minimum measurement is 0.14.

EXAMPLE 4

From the GaN substrates as the nitride semiconductor single crystal substrates 5 obtained in Example 1, one nitride semiconductor single crystal substrate 5 that is obtained from an outermost surface side of the second nitride semiconductor single crystal layer 4 is chosen, and put into the HYPE furnace as a seed crystal and the Si doped GaN crystal that has a thickness of 5 mm as the third nitride semiconductor single crystal layer 6 is homo-epitaxially grown in the same conditions as the second nitride semiconductor single crystal layer 4 in Example 1. An appearance of the obtained GaN crystal shows no sign that exhibits the occurrence of a crack or an abnormal growth, and any deep pit etc. is not observed on the surface of the crystal.

Next, a GaN substrate as the nitride semiconductor single crystal substrate 7 is cut from the third nitride semiconductor single crystal layer 6. In the cutting the third nitride semiconductor single crystal layer 6, the outer periphery of the third nitride semiconductor single crystal layer 6 is not cut, and the third nitride semiconductor single crystal layer 6 is cut orthogonal to the crystal growth direction using multi-wire saw to obtain the nitride semiconductor single crystal substrate 7 that has the thickness of 500 μm. In the cutting process of the third nitride semiconductor single crystal layer 6, there is no crack generated in the crystal. Thus, the six nitride semiconductor single crystal substrates 7 are obtained.

The obtained nitride semiconductor single crystal substrate 7 is subjected to the OF, IF processing to the outer periphery, and then chamfering and shaping to have a diameter of 49 mm, using a beveling machine. Also the front and rear surfaces of the nitride semiconductor single crystal substrate 7 are lapped and polished, and finally formed into a mirror substrate that has a diameter of 400 μm. In the polishing, no defection such as a crack in the nitride semiconductor single crystal substrate 7 during the processing is found.

At the center of the mirror polished nitride semiconductor single crystal substrate 7, when an angle between the c-axis and the surface of the substrate is measured using the x-ray diffraction method, the angle is 0.00°. Also by carrying out the same measurement at eight points in total that is arranged at every ±5 mm from the center of the nitride semiconductor single crystal substrate 5 on the diameter of the substrate, when the dispersion of the nine measurement results in total is researched, the dispersion is smaller than the dispersion in the Example 1 and the difference between the maximum measurement and the minimum measurement is about 0.02°.

Also, when the dislocation density of the nitride semiconductor single crystal substrate 7 cut from the outermost surface side of the third nitride semiconductor single crystal layer 6 is evaluated by the scotoma density confirmed by the cathode luminescence, it is confirmed that is in the range from 4 to $8 \times 10^6$ cm$^{-2}$ in the measurement at nine points on the surface. Hereby it is confirmed that the dislocation density can be reduced by reusing the nitride semiconductor single crystal substrate obtained gradually from the embodiment described above as the seed crystal.

COMPARATIVE EXAMPLE 3

A chosen one of the GaN substrates obtained in Comparative Example 2 that the has no crack is, as a seed crystal, put into the HYPE furnace, whereby a Si doped GaN crystal that has a thickness of 3 mm is homo-epitaxially grown by the same conditions as the second nitride semiconductor single crystal layer 4 in Example 1. Although a growth experiment is tried several times, because the crack occurs in the GaN crystal reproducibly in slicing the grown GaN crystal when a thickness of the GaN crystal is over 4 mm, the growth thickness of the GaN crystal is 3 mm in consideration of a margin. An appearance of the thus obtained GaN crystal shows, similarly to Example 1, no sign that exhibits the occurrence of a crack or abnormal growth, and any pit etc. is not observed on the surface of the crystal.

Next, the GaN substrate is cut from the GaN crystal. In cutting the GaN crystal, the outer periphery of the GaN crystal is not cut, and the GaN crystal is cut orthogonal to the crystal growth direction using multi-wire saw to obtain the GaN substrate that has the thickness of 500 μm. As the thickness of the growth crystal is limited thinly, in the cutting process, there is no crack generated in the crystal. Thus, the six nitride semiconductor single crystal substrates 7 are obtained.

The obtained GaN substrate is applied the OF processing and the IF processing to the outer periphery, and chamfer shaping to have a diameter of 49 mm, using a beveling machine. Also the front and rear surfaces of the GaN substrate are lapped and polished, and finally formed into a mirror substrate that has a diameter of 400 μm. In the polishing, no defection such as a crack in the GaN substrate during the processing is found.

At the center of the mirror polished nitride semiconductor single crystal substrate 7, when an angle between the c-axis and the surface of the substrate is measured using the x-ray diffraction method, the angle is 0.04°. Also by carrying out the same measurement at eight points in total that is arranged at every ±5 mm from the center of the nitride semiconductor single crystal substrate 5 on the diameter of the substrate, when the dispersion of the nine measurement results in total is researched, the dispersion is the difference between the maximum measurement and the minimum measurement is about 0.15°.

According to the result, when the GaN substrate that has large dispersion of the crystal direction is used as the seed crystal, it is confirmed that it is easy to generate the crack by generating the strain in the growing crystal, and the large dispersion of the crystal direction in the surface leaves as usual.

EXAMPLE 5

A Si doped GaN crystal is provided that has a thickness of 5 mm and is, as the second nitride semiconductor single crystal layer 4, grown on the template 10 under the same conditions as Example 1.

Next, the second nitride semiconductor single crystal layer 4 with a conductive wax applied to the side thereof is attached to a fixture, and the outer periphery is removed by engraving the crystal from the side of the sapphire substrate as the heterogeneous substrate 1 using the diamond electroplated grinding wheel that has an inner diameter of 52 mm Meanwhile, the removing outer peripheral region is stopped so as to leave a 1 mm thick region of the second nitride semiconductor single crystal layer 4 on the surface side.

The second nitride semiconductor single crystal layer 4 with the outer periphery ground and removed is cut using the wire electric discharge machine orthogonally to the crystal growth direction while attaching the side of the second nitride semiconductor single crystal layer 4 to the fixture. In cutting the second nitride semiconductor single crystal layer 4, a 500 µm thick GaN substrate as the nitride semiconductor single crystal substrate 5 is obtained from the region with the outer periphery removed, and the region at the outermost surface side that the outer periphery is not removed is left as a substrate that has a thickness of about 1 mm. In the removing process of the outer periphery and the cutting process, no crack is generated in the second nitride semiconductor single crystal layer 4. Thus, five nitride semiconductor single crystal substrates 5 that have a thickness of 500 µm and one nitride semiconductor single crystal substrate 5 that has an as-grown surface and a thickness of 1 mm are obtained.

The nitride semiconductor single crystal substrate 5 that is cut of which diameter is 500 µm is subjected to the OF and IF processing to the outer periphery, and chamfering and shaping to have a diameter of 50.8 mm, using a beveling machine. Also the front and rear surfaces of the nitride semiconductor single crystal substrate 5 are lapped and polished, and finally formed into a mirror substrate that has a diameter of 400 µm. In the polishing, no defection such as a crack in the nitride semiconductor single crystal substrate 5 during the processing is found.

EXAMPLE 6

The rear surface (cutting surface) side of the nitride semiconductor single crystal substrate 5 that is obtained in Example 5 and has the as-grown surface is flattened by being ground so as to have a thickness of 800 µm at the center region of the substrate. The nitride semiconductor single crystal substrate 5 is washed and put as the seed crystal substrate in the HYPE furnace, and the Si doped GaN crystal as the third nitride semiconductor single crystal layer 6 is homo-epitaxially grown to a thickness of 5 mm under the same conditions as Example 4.

The appearance of the obtained third nitride semiconductor single crystal layer 6 shows no sign that exhibits the occurrence of a crack or abnormal growth, and any pit etc. is not observed on the surface of the crystal. Also, there is no problem in the cutting process later, and the characteristic of the obtained GaN substrate as nitride semiconductor single crystal substrate 7 is similar or better than the product made in Example 5. Thus, it is confirmed that the nitride semiconductor single crystal substrate 5 that has the as-grown surface can be used as the seed crystal.

Although the embodiments and the Examples have been described, the invention is not limited by the embodiments and the Examples. The various kinds of modifications can be implemented without departing from the gist of the invention.

For example, instead of the second nitride semiconductor single crystal layer 4 or the third nitride semiconductor single crystal layer 6 in the embodiments described above, a multi-layer structure of the nitride semiconductor single crystal for forming a device may be epitaxially grown.

Also, if the groove processing as in the first embodiment is conducted with respect to the surface of a GaN substrate that has a crystal orientation distribution and is made from the hetero-epitaxially grown GaN crystal and then a GaN crystal is homo-epitaxially is grown on the surface of the GaN substrate, the nitride semiconductor single crystal layer can be obtained that is similar to the second nitride semiconductor single crystal layer 4 in the first embodiment.

Also, the invention is not to be limited to the embodiments and the Examples. Further, it should be noted that all combinations of the features described in the embodiments and the Examples are not necessary to solve the problems of the invention.

INDUSTRIAL APPLICABILITY

A nitride semiconductor single crystal substrate manufacturing method can be provided that suppresses the occurrence of the crack by relaxing the strain in the grown nitride semiconductor single crystal and that allows a high quality nitride semiconductor single crystal substrate to be efficiently obtained.

REFERENCE SIGNS LIST

1: HETEROGENEOUS SUBSTRATE
2: FIRST NITRIDE SEMICONDUCTOR SINGLE CRYSTAL LAYER
3: GROOVE
4: SECOND NITRIDE SEMICONDUCTOR SINGLE CRYSTAL LAYER
5: NITRIDE SEMICONDUCTOR SINGLE CRYSTAL SUBSTRATE
6: THIRD NITRIDE SEMICONDUCTOR SINGLE CRYSTAL LAYER
7: NITRIDE SEMICONDUCTOR SINGLE CRYSTAL SUBSTRATE
10: TEMPLATE

The invention claimed is:
1. A nitride semiconductor single crystal substrate manufacturing method, comprising:

providing a template by hetero-epitaxially growing a first nitride semiconductor single crystal layer on a heterogeneous substrate, wherein the template has a diameter not less than 50 mm;

forming a plurality of linear grooves on a surface of the template that have a depth reaching an inside of the heterogeneous substrate and passing through the first nitride semiconductor single crystal layer, wherein a pattern of the plurality of the linear grooves has three-fold or six-fold rotational symmetry with respect to a central axis of the template, wherein each of the linear grooves remains linear across the length of the template;

epitaxially growing a second nitride semiconductor single crystal layer on the template with the plurality of the linear grooves formed thereon; and cutting a nitride semiconductor single crystal substrate from the second nitride semiconductor single crystal layer, wherein a pitch between parallel grooves of the plurality of the linear grooves is not less than 100 µm and not more than 5 mm.

2. The method according to claim 1, wherein the first nitride semiconductor single crystal layer comprises an $Al_xGa_{(1-X)}N$ (0<X<1) crystal grown by a Metal Organic Chemical Vapor Deposition (MOCVD) method or a Hydride Vapor Phase Epitaxy (HVPE) method.

3. The method according to claim 1, wherein the second nitride semiconductor single crystal layer comprises an $Al_YGa_{(1-Y)}N$ (0<Y<1) crystal grown by a Hydride Vapor Phase Epitaxy (HVPE) method.

4. The method according to claim 1, wherein the first nitride semiconductor single crystal layer and the second nitride semiconductor single crystal layer have a same composition.

5. The method according to claim 1, wherein a thickness of the heterogeneous substrate of a region just below the plurality of the linear grooves except an intersection point of the plurality of the linear grooves is not less than 50 µm and not more than 200 µm.

6. The method. according to claim 1, wherein a thickness of the heterogeneous substrate of a region just below an intersection point of the plurality of the linear grooves is less than a thickness of the heterogeneous substrate at a region just below the plurality of the grooves except the intersection point of the plurality of the grooves.

7. The method according to claim 1, wherein a width of the plurality of the linear grooves in the first nitride semiconductor single crystal layer is not less than 10 µm and not more than 50 µm.

8. The method according to claim 1, wherein a width of the plurality of the linear grooves in the heterogeneous substrate is equal to a width of the plurality of the linear grooves in the first nitride semiconductor single crystal layer.

9. The method according to claim 1, wherein a depth of the plurality of the linear grooves in the heterogeneous substrate is not less than three times a width of the plurality of the linear grooves in the first nitride semiconductor single crystal layer.

10. The method according to claim 1, wherein a thickness of the first nitride semiconductor single crystal layer is not less than 1µm and not more than 10 µm.

11. The method according to claim 1, wherein a thickness of the second nitride semiconductor single crystal layer is not less than 500 µm.

12. The method according to claim 1, wherein a thickness of the heterogeneous substrate at a region just below the plurality of the linear grooves except an intersection point of the plurality of the linear grooves is not more than one tenth of a thickness of the grown second nitride semiconductor single crystal layer.

13. The method according to claim 1, wherein the template having the plurality of the linear grooves is etched before growing the second nitride semiconductor single crystal layer.

14. The method according to claim 13, wherein the etching is conducted in a heated mixed liquid of phosphoric acid and sulfuric acid.

15. The method according to claim 1, wherein an upper surface of the first nitride semiconductor single crystal layer is a c-plane of a single crystal that composes the first nitride semiconductor single crystal layer or a surface inclined within 5° from the c-plane.

16. The method according to claim 15, wherein the plurality of the linear grooves are parallel to an a-plane or an m-plane of a single crystal that composes the first nitride semiconductor single crystal layer.

17. The method according to claim 1, wherein the first nitride semiconductor single crystal layer is sectioned by the plurality of the linear grooves into a plurality of regions having an equal area.

18. The method according to claim 1, wherein a groove processing in the first nitride semiconductor single crystal layer and a groove processing in the heterogeneous substrate are conducted in a same process in the forming of the plurality of the linear grooves.

19. The method according to claim 1, wherein the second nitride semiconductor single crystal layer is epitaxially grown so as to leave gaps in the plurality of the linear grooves in the heterogeneous substrate.

20. The method according to claim 19, wherein, after the second nitride semiconductor single crystal layer is grown, all of the gaps are connected in the plurality of the linear grooves in the heterogeneous substrate and are connected to an external space of the heterogeneous substrate through an opening of the plurality of the linear grooves at an outer periphery of the heterogeneous substrate.

21. The method according to claim 1, wherein the second nitride semiconductor single crystal layer is epitaxially grown such that a polycrystal or an amorphous phase that has a same composition as the second nitride semiconductor single crystal layer is formed in the plurality of the linear grooves in the heterogeneous substrate.

22. The method according to claim 1, wherein the second nitride semiconductor single crystal layer is grown such that the second nitride semiconductor single crystal layer becomes a continuous film that covers an upper of the plurality of the linear grooves.

23. The method according to claim 1, wherein the second nitride semiconductor single crystal layer is grown while leaving on a growth interface a concavity and a convex corresponding to a shape of a region of the first nitride semiconductor single crystal layer sectioned by the plurality of the linear grooves.

24. The method according to claim 1, wherein, before cutting the nitride semiconductor single crystal substrate from the second nitride semiconductor single crystal layer, an outer periphery of the second nitride semiconductor single crystal layer that is not less than 5 mm in thickness is removed.

25. The method according to claim 1, wherein the first nitride semiconductor single crystal layer is grown by being substantially undoped and the second nitride semiconductor single crystal layer is grown intentionally by doping an impurity.

26. The method according to claim 25, wherein the impurity comprises at least one selected from Si, S, Se, Ge, O, Fe, Mg and Zn, and
   wherein a concentration of the impurity doped into the second nitride semiconductor single crystal layer is not less than $5 \times 10^{17}$ cm$^{-3}$.

27. The method according to claim 2, wherein the second nitride semiconductor single crystal layer comprises an $Al_YGa_{(1-Y)}N$ (0<Y<1) crystal grown by a Hydride Vapor Phase Epitaxy (HVPE) method.

28. The method according to claim 2, wherein the first nitride semiconductor single crystal layer and the second nitride semiconductor single crystal layer have a same composition.

29. The method according to claim 1, wherein the plurality of linear grooves have a periodicity.

30. The method according to claim 1, wherein the plurality of linear grooves are arranged in parallel to each other at an even interval.

31. The method according to claim 1, wherein the plurality of linear grooves are arranged in a lattice pattern of regular hexagons or regular triangles.

32. The method according to claim 1, wherein the plurality of linear grooves are configured by a combination of lines parallel to a single axis of a single crystal configuring the first nitride semiconductor single crystal layer.

* * * * *